US012652885B2

(12) United States Patent
Lin

(10) Patent No.: US 12,652,885 B2
(45) Date of Patent: Jun. 9, 2026

(54) LIGHT-EMITTING DEVICES AND MANUFACTURING METHOD THEREOF

(71) Applicant: TCL Technology Group Corporation, Huizhou (CN)

(72) Inventor: Xiongfeng Lin, Huizhou (CN)

(73) Assignee: TCL Technology Group Corporation, HuiZhou (CN)

( * ) Notice: Subject to any disclaimer, the term of this patent is extended or adjusted under 35 U.S.C. 154(b) by 405 days.

(21) Appl. No.: 18/390,006

(22) Filed: Dec. 20, 2023

(65) Prior Publication Data

US 2024/0120441 A1       Apr. 11, 2024

Related U.S. Application Data

(63) Continuation     of     application     No. PCT/CN2022/121454, filed on Sep. 26, 2022.

(30) Foreign Application Priority Data

Oct. 20, 2021      (CN) ......................... 202111222072.7

(51) Int. Cl.
*H10H 20/812*          (2025.01)
*H10H 20/01*            (2025.01)
(Continued)

(52) U.S. Cl.
CPC .......... *H10H 20/812* (2025.01); *H10H 20/01* (2025.01); *H10H 20/823* (2025.01);
(Continued)

(58) Field of Classification Search
CPC ...... H10H 20/812; H10H 20/01; H10K 50/15; H10K 50/16; H10K 50/805; H10K 71/00
See application file for complete search history.

(56) References Cited

U.S. PATENT DOCUMENTS 7,560,735 B2      7/2009  Furukawa et al.
9,391,287 B1      7/2016  Huang et al.
(Continued)

FOREIGN PATENT DOCUMENTS

CN              1851953       10/2006
CN              107346776     11/2017
WO      WO 2023/065984        4/2023

OTHER PUBLICATIONS

International Search Report and the Written Opinion Dated Nov. 23, 2022 From the International Searching Authority Re. Application No. PCT/CN2022/121454 and Its Translation Into English. (11 Pages).

*Primary Examiner* — David Vu
*Assistant Examiner* — Brandon C Fox

(57)              ABSTRACT

Disclosed herein are a light-emitting device including a first electrode, a first functional layer, a patterned insulating layer, a patterned second electrode, a patterned second functional layer, and a light-emitting layer, and a methods of manufacturing the same. In the present disclosure, an orthographic projection of the patterned second electrode on the first functional layer is located within an orthographic projection of the patterned insulating layer on the first functional layer, so as to avoid the contact of the patterned second functional layer with the first functional layer, and avoid a current leakage of the light-emitting device.

20 Claims, 8 Drawing Sheets

(51) Int. Cl.

| | |
|---|---|
| *H10H 20/823* | (2025.01) |
| *H10H 20/824* | (2025.01) |
| *H10H 20/832* | (2025.01) |
| *H10K 50/15* | (2023.01) |
| *H10K 50/16* | (2023.01) |
| *H10K 50/805* | (2023.01) |
| *H10K 71/00* | (2023.01) |

(52) U.S. Cl.

CPC ........ *H10H 20/824* (2025.01); *H10H 20/832* (2025.01); *H10K 50/15* (2023.02); *H10K 50/16* (2023.02); *H10K 50/805* (2023.02); *H10K 71/00* (2023.02)

(56)                References Cited

U.S. PATENT DOCUMENTS

| | | | |
|---|---|---|---|
| 10,741,623 B2* | 8/2020 | Wang ..................... | H10K 59/35 |
| 2010/0090202 A1 | 4/2010 | Obata et al. | |
| 2017/0047550 A1* | 2/2017 | Lee ........................ | H10K 50/11 |
| 2019/0386088 A1* | 12/2019 | Xu ........................ | H10K 77/111 |
| 2021/0074945 A1* | 3/2021 | Kim ..................... | H10K 59/879 |

* cited by examiner

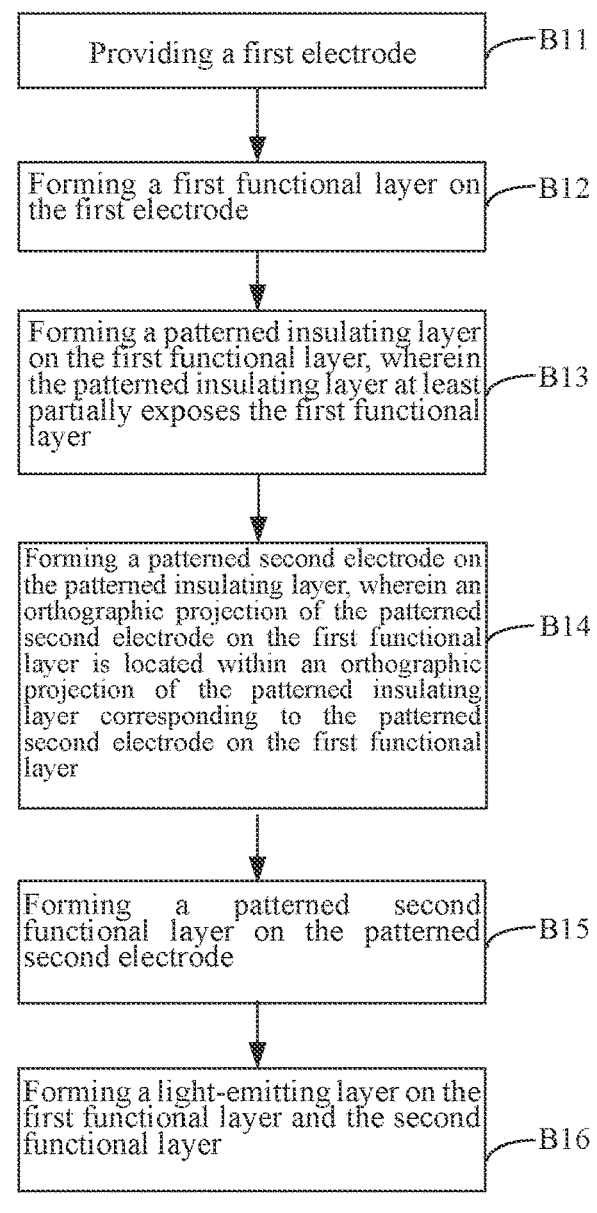

Providing a first electrode — B11

Forming a first functional layer on the first electrode — B12

Forming a patterned insulating layer on the first functional layer, wherein the patterned insulating layer at least partially exposes the first functional layer — B13

Forming a patterned second electrode on the patterned insulating layer, wherein an orthographic projection of the patterned second electrode on the first functional layer is located within an orthographic projection of the patterned insulating layer corresponding to the patterned second electrode on the first functional layer — B14

Forming a patterned second functional layer on the patterned second electrode — B15

Forming a light-emitting layer on the first functional layer and the second functional layer — B16

FIG. 3

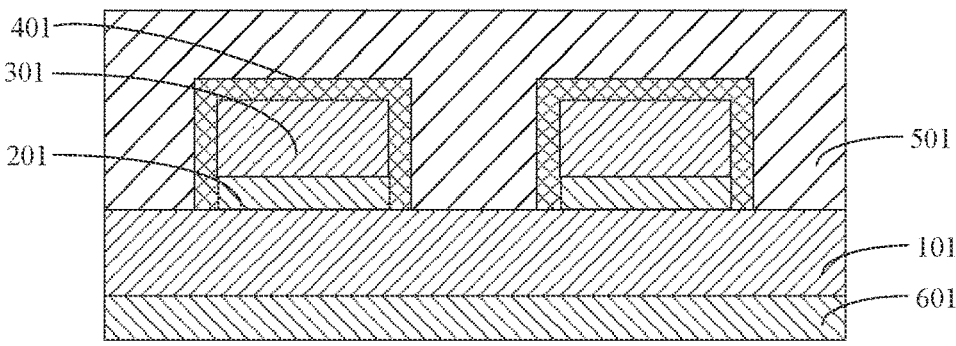

FIG. 4

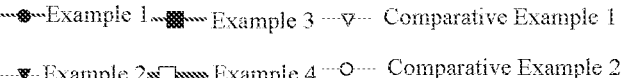
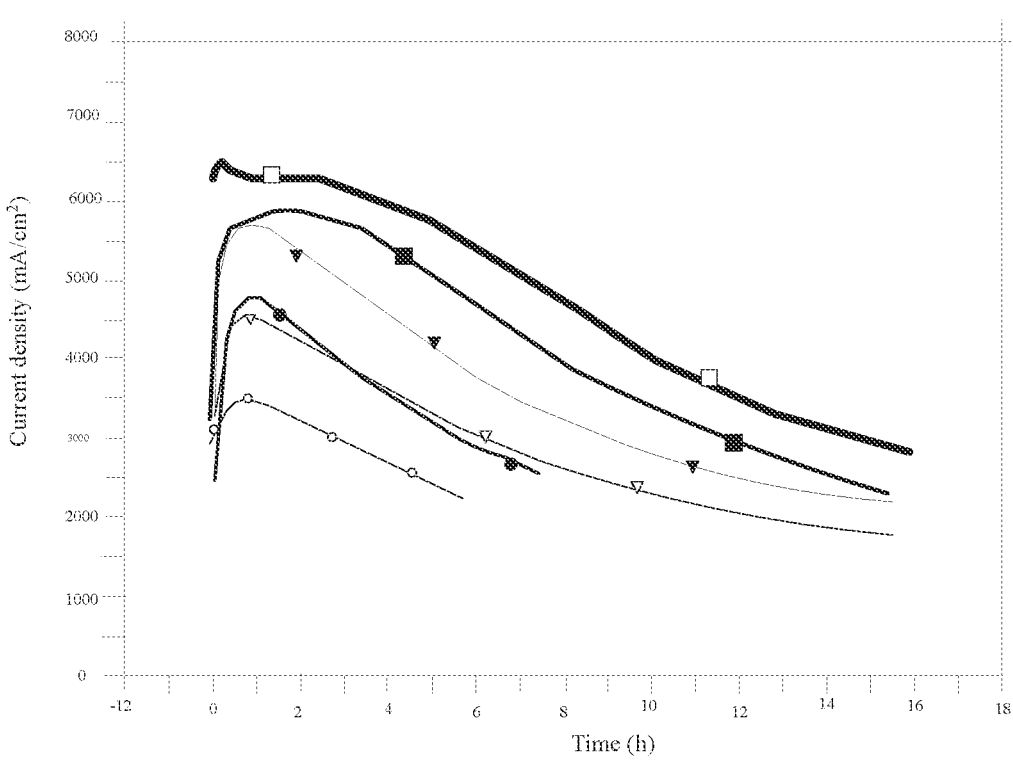
FIG. 7

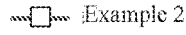
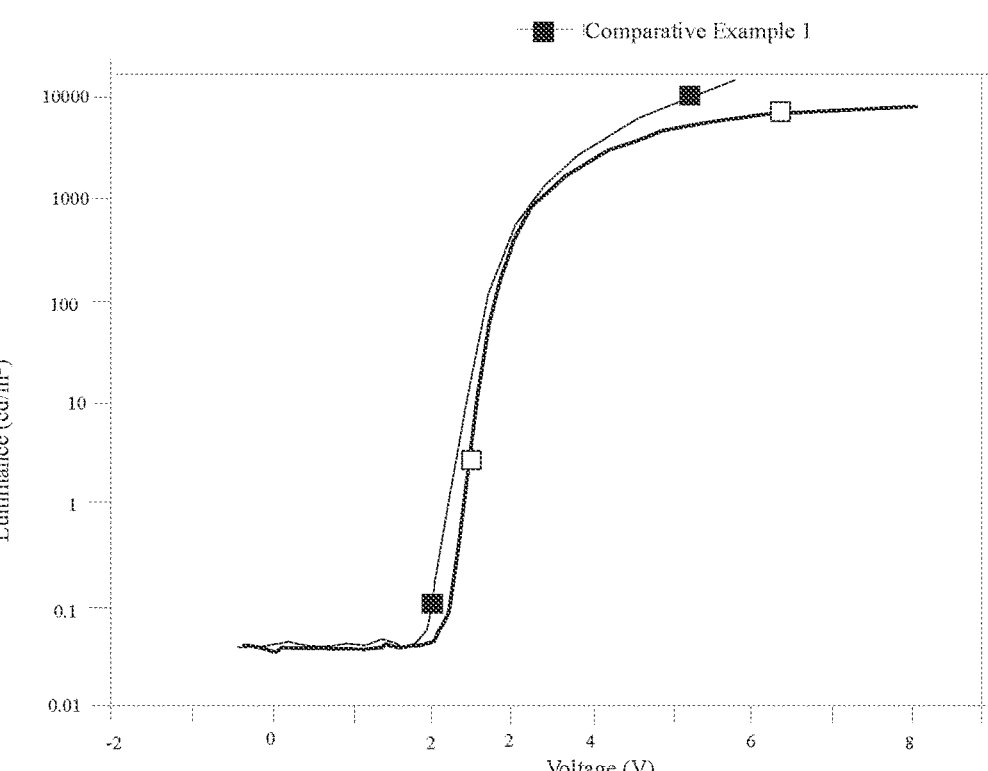
FIG. 8
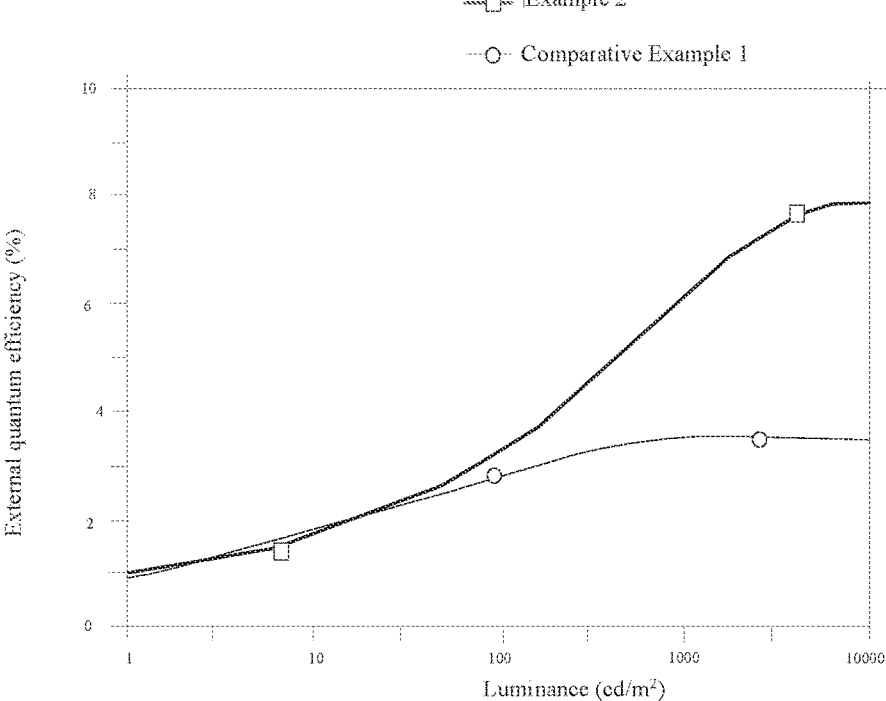
FIG. 9

LIGHT-EMITTING DEVICES AND MANUFACTURING METHOD THEREOF

CROSS-REFERENCE TO RELATED APPLICATION

This application is a Continuation of PCT Patent Application No. PCT/CN2022/121454 having International filing date of Sep. 26, 2022, which claims the benefit of priority of China Patent Application No. 202111222072.7 filed on Oct. 20, 2021. The contents of the above applications are all incorporated by reference as if fully set forth herein in their entirety.

TECHNICAL FIELD

The present disclosure relates to the field of display, and more particularly, to a light-emitting device and a manufacturing method thereof.

BACKGROUND

In recent years, with the in-depth research on the performance of quantum dot light-emitting diode devices, there is great progress in current efficiency and lifetime of the devices. The current efficiency is directly proportional to the external quantum efficiency (EQE), however, current leakage usually occurs in the quantum dot light-emitting diode device.

Technical Problem

Therefore, there is a need for a structure that can solve a current leakage problem of a device.

Technical Solutions

Embodiments of the present disclosure provide a light-emitting device and a method of manufacturing the same to solve a current leakage problem of a light-emitting device.

The present disclosure provides a light-emitting device including:

a first electrode;

a first functional layer disposed on the first electrode;

a patterned insulating layer disposed on the first functional layer, the patterned insulating layer at least partially exposing the first functional layer;

a patterned second electrode disposed on the patterned insulating layer, an orthographic projection of the patterned second electrode on the first functional layer being located within an orthographic projection of the patterned insulating layer corresponding to the patterned second electrode on the first functional layer;

a patterned second functional layer covering the patterned second electrode; and a light-emitting layer disposed on the first functional layer and covering the patterned second functional layer and the first functional layer;

wherein one of the first electrode and the patterned second electrode is an anode, and another is a cathode; one of the first functional layer and the patterned second functional layer is an electron functional layer, and another is a hole functional layer; the electron functional layer is close to the cathode, and the hole functional layer is close to the anode.

Optionally, in some embodiments of the present disclosure, an orthographic projection of the patterned second functional layer on the first functional layer is located within an orthographic projection of the patterned insulating layer corresponding to the patterned second functional layer on the first functional layer.

Optionally, in some embodiments of the present disclosure, a distance between an edge of the orthographic projection of the patterned second functional layer on the first functional layer and an edge of the orthographic projection of the patterned insulating layer corresponding to the patterned second functional layer on the first functional layer is greater than 5 nm.

Optionally, in some embodiments of the present disclosure, the patterned insulating layer has a thickness of 30 nm to 100 nm.

Optionally, in some embodiments of the present disclosure, a distance between an edge of the orthographic projection of the patterned second electrode on the first functional layer and an edge of the orthographic projection of the patterned insulating layer corresponding to the patterned second electrode on the first functional layer is greater than a range from 20 nm to 105 nm.

Optionally, in some embodiments of the present disclosure, a material of the anode is selected from one or more of Pt, Ni, Cu, Ag, Al, or Au;

a material of the cathode is selected from one or more of ITO, FTO, Fe, Cu, Al, Sn, Zn, or Ag;

a material of the hole functional layer is selected from one or more of nickel oxide, copper oxide, poly(3,4-ethylenedioxythiophene):polystyrene sulfonate, cuprous thiocyanate, polyvinyl carbazole, poly[N,N'-bis(4-butylphenyl)-N,N'-bis(phenyl)benzidine] (Poly-TPD), poly(9,9-dioctylfluorene-co-bis(N,N-phenyl-1,4-phenylenediamine) (PFB), 4,4',4"-tris(carbazol-9-yl)-triphenylamine (TCTA), 4,4'-bis(9-carbazolyl)-biphenyl (CBP), N,N'-diphenyl-N,N'-di(3-methylphenyl)-1,1'-biphenyl-4,4'-diamine (TPD), or N,N'-diphenyl-N,N'-(1-naphthyl)-(1,1'-biphenyl)-4,4'-diamine (NPB);

a material of the electron functional layer is selected from one or more of $TiO_2$, ZnO, SnO, ZnMgO, AlZnO, ZnSnO, ZrO, AlZnMgO, Li-doped $TiO_2$, Ru-doped $TiO_2$, doped graphene, undoped graphene, $C_{60}$, GaZnO, or ZnMgLiO;

the light-emitting layer is a quantum dot light-emitting layer, a material of the quantum dot light-emitting layer is selected from one or more of a single-structural quantum dot or a core-shell structural quantum dot, the single-structural quantum dot is selected from one or more of a group II-VI compound, a group III-V compound, or a group I-II-VI compound, the group II-VI compound is selected from one or more of CdSe, CdS, CdTe, ZnSe, ZnS, CdTe, ZnTe, CdZnS, CdZnSe, CdZnTe, ZnSeS, ZnSeTe, ZnTeS, CdSeS, CdSeTe, CdTeS, CdZnSeS, CdZnSeTe, or CdZnSTe; the group III-V compound is selected from one or more of InP, InAs, GaP, GaAs, GaSb, AlN, AlP, InAsP, InNP, InNSb, GaAlNP, or InAlNP; the group I-III-VI compound is selected from one or more of $CuInS_2$, $CuInSe_2$, or $AgInS_2$; a core layer of the core-shell structural quantum dot is any of the single-structural quantum dot, and a shell layer of the core-shell structural quantum dot is selected from one or more of CdS, CdTe, CdSeTe, CdZnSe, CdZnS, CdSeS, ZnSe, ZnSeS, or ZnS.

Optionally, in some embodiments of the present disclosure, an orthographic projection of the patterned second electrode on the patterned insulating layer is located within an orthographic projection of the patterned second functional layer corresponding to the patterned second electrode on the patterned insulating layer.

Optionally, in some embodiments of the present disclosure, the orthographic projection of the patterned second electrode on the first functional layer is located within the orthographic projection of the patterned insulating layer corresponding to the patterned second electrode on the first functional layer.

Optionally, in some embodiments of the present disclosure, an orthographic projection of the patterned second functional layer on the first functional layer is located within an orthographic projection of the patterned insulating layer corresponding to the patterned second functional layer on the first functional layer.

Optionally, in some embodiments of the present disclosure, a distance between an edge of the orthographic projection of the patterned second functional layer on the first functional layer and an edge of the orthographic projection of the patterned insulating layer corresponding to the patterned second functional layer on the first functional layer is greater than 5 nm; and a distance between an edge of the orthographic projection of the patterned second electrode on the first functional layer and an edge of the orthographic projection of the patterned insulating layer corresponding to the patterned second electrode on the first functional layer is greater than a range from 20 nm to 105 nm.

In addition, the present disclosure provides a method of manufacturing a light-emitting device, including:

providing a first electrode;

forming a first functional layer on the first electrode;

forming a patterned insulating layer on the first functional layer, the patterned insulating layer at least partially exposing the first functional layer;

forming a patterned second electrode on the patterned insulating layer, wherein an orthographic projection of the patterned second electrode on the first functional layer is located within an orthographic projection of the patterned insulating layer corresponding to the patterned second electrode on the first functional layer;

forming a patterned second functional layer on the patterned second electrode; and forming a light-emitting layer on the first functional layer and the patterned second functional layer;

wherein one of the first electrode and the patterned second electrode is an anode, and another is a cathode; one of the first functional layer and the patterned second functional layer is an electron functional layer, and another is a hole functional layer; the electron functional layer is close to the cathode, and the hole functional layer is close to the anode.

Optionally, in some embodiments of the present disclosure, the step of forming the patterned insulating layer on the first functional layer, the patterned insulating layer at least partially exposing the first functional layer, includes:

forming a first light-shielding layer having a plurality of through-holes on the first functional layer, the through-holes extending through the first light-shielding layer to expose a portion of the first functional layer;

forming a patterned insulating layer in the through-holes; and removing the first light-shielding layer.

Optionally, in some embodiments of the present disclosure, the step of forming the patterned second electrode on the patterned insulating layer includes:

forming a second light-shielding layer having a plurality of via holes on the first functional layer and the patterned insulating layer, the via holes corresponding to the patterned insulating layer, and the via holes extending through the second light-shielding layer to expose a portion of the patterned insulating layer; and forming a patterned second electrode in the via holes, wherein the orthographic projection of the patterned second electrode on the first functional layer is located within the orthographic projection of the patterned insulating layer on the first functional layer.

Optionally, in some embodiments of the present disclosure, the step of forming the patterned second functional layer on the patterned second electrode includes:

removing the second light-shielding layer;

oxidizing the patterned second electrode to form the patterned second functional layer on a surface of the patterned second electrode, wherein an orthographic projection of the patterned second functional layer on the first functional layer is located within an orthographic projection of the patterned insulating layer on the first functional layer.

Optionally, in some embodiments of the present disclosure, a material of the patterned second electrode includes a conductive material, and a material of the patterned second functional layer includes an oxide of the conductive material.

Optionally, in some embodiments of the present disclosure, the patterned second electrode is an anode, the patterned second functional layer is a hole functional layer, a material of the anode is selected from one or two of Ni or Cu, and a material of the hole functional layer is selected from one or two of nickel oxide or copper oxide.

Optionally, in some embodiments of the present disclosure, the patterned second electrode is a cathode, the patterned second functional layer is an electron functional layer, a material of the cathode is selected from one or two of Ti, Zn, or Sn, and a material of the electron functional layer is selected from one or two of $TiO_2$, $ZnO$, or $SnO_2$.

Optionally, in some embodiments of the present disclosure, the step of forming the patterned second functional layer on the patterned second electrode includes:

depositing a material of the patterned second functional layer on the patterned insulating layer and the patterned second electrode to form the patterned second functional layer, wherein an orthographic projection of the patterned second functional layer on the first functional layer is located within the orthographic projection of the patterned insulating layer on the first functional layer; and removing the second light-shielding layer.

Optionally, in some embodiments of the present disclosure, the patterned second electrode is an anode, the patterned second functional layer is a hole functional layer, a material of the anode is selected from one or more of Pt, Ni, Cu, Ag, Al, or Au, and a material of the hole functional layer is selected from one or more of nickel oxide, copper oxide, poly(3,4-ethylenedioxythiophene):polystyrene sulfonate, cuprous thiocyanate, polyvinyl carbazole, poly[N,N'-bis(4-butylphenyl)-N,N'-bis(phenyl)benzidine] (Poly-TPD), poly (9,9-dioctylfluorene-co-bis(N,N-phenyl-1,4-phenylenedi-amine) (PFB), 4,4',4"-tris(carbazol-9-yl)-triphenylamine (TCTA), 4,4'-bis(9-carbazolyl)-biphenyl (CBP), N,N'-di-phenyl-N,N'-di(3-methylphenyl)-1,1'-biphenyl-4,4'-diamine (TPD), or N,N'-diphenyl-N,N'-(1-naphthyl)-(1,1'-biphenyl)-4,4'-diamine (NPB).

Optionally, in some embodiments of the present disclosure, the patterned second electrode is a cathode, the patterned second functional layer is an electron functional layer, a material of the cathode is selected from one or more of ITO, FTO, Fe, Cu, Al, Sn, Zn, or Ag, and a material of the electron functional layer is selected from one or more of $TiO_2$, ZnO, SnO, ZnMgO, AlZnO, ZnSnO, ZrO, AlZnMgO, Li-doped $TiO_2$, Ru-doped $TiO_2$, doped graphene, undoped graphene, $C_{60}$, GaZnO, or ZnMgLiO.

Beneficial Effect

Embodiments of the present disclosure disclose a light-emitting device and a manufacturing method thereof, in which the light-emitting device includes a first electrode, a first functional layer, a patterned insulating layer, a patterned second electrode, a patterned second functional layer, and a light-emitting layer. The first functional layer is disposed on the first electrode, the patterned insulating layer is disposed on the first functional layer, the patterned second electrode is disposed on the patterned insulating layer, the patterned second functional layer covers the patterned second electrode, an orthographic projection of the patterned second electrode on the first functional layer is disposed within an orthographic projection of the patterned insulating layer on the first functional layer, and the light-emitting layer covers the patterned second functional layer and the first functional layer. One of the first electrode and the second electrode is an anode, and another is a cathode; One of the first functional layer and the second functional layer is an electron functional layer, and another is a hole functional layer, and the electron functional layer is close to the cathode and the hole functional layer is close to the anode. In the present disclosure, the orthographic projection of the patterned second electrode on the first functional layer is disposed within the orthographic projection of the patterned insulating layer on the first functional layer, so as to avoid the contact of the patterned second functional layer with the first functional layer, thereby avoiding a current leakage problem of the light-emitting device, and improving the performance of the light-emitting device.

BRIEF DESCRIPTION OF THE DRAWINGS

In order to illustrate the technical solutions in the embodiments of the present disclosure clearly, the accompanying drawings involved in the description of the embodiments will now be described briefly. It will be apparent that the accompanying drawings in the following description are merely some of the embodiments of the present disclosure, and based on these drawings, other drawings may be made by those skilled in the art without involving any inventive effort.

FIG. 3 is a flowchart of a method of manufacturing a light-emitting device according to some embodiments of the present disclosure.

FIG. 4 is a schematic structural diagram of a light-emitting device of the prior art.

FIG. 7 is a schematic graph of luminance versus time of a light-emitting device according to some embodiments of the present disclosure.

FIG. 8 is a comparison graph of voltage versus luminance of light-emitting devices according to Example 2 and Comparative Example 1 of the present disclosure.

FIG. 9 is a comparison graph of luminance versus external quantum efficiency of light-emitting devices according to Example 2 and Comparative Example 1 of the present disclosure.

DETAILED DESCRIPTION OF THE EMBODIMENTS

Figure 1:
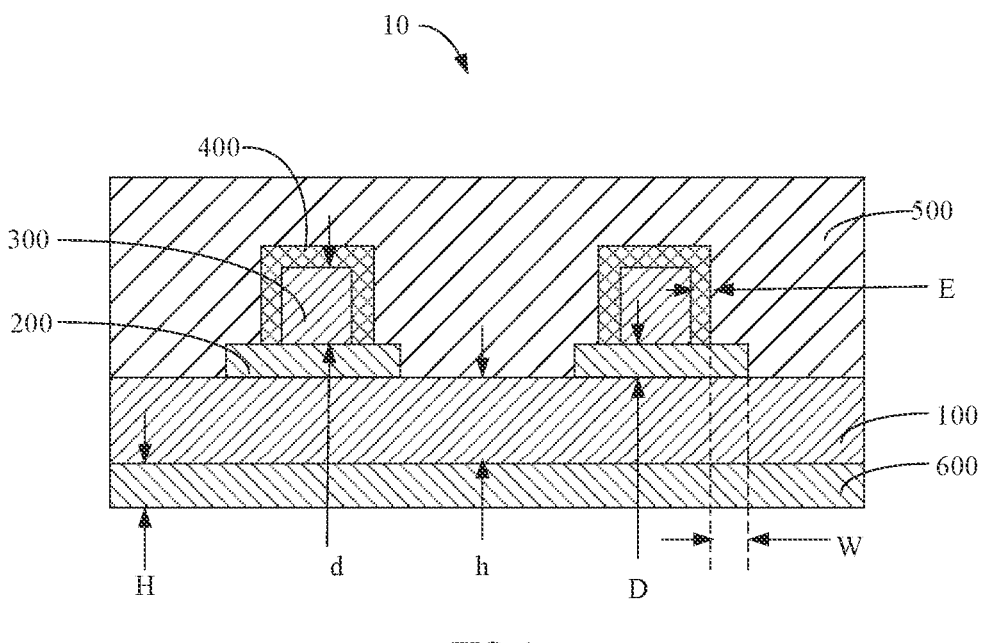
FIG. 1 is a schematic diagram of a first structure of a light-emitting device according to some embodiments of the present disclosure.

Embodiments of the present disclosure will be clearly and fully described in connection with the accompanying drawings of the present disclosure. It will be apparent that the described embodiments are merely a part of the embodiments of the present disclosure, rather than all of the embodiments. Based on the embodiments of the present disclosure, all other embodiments obtained by a person skilled in the art without involving any inventive effort fall within the scope of the present disclosure. Furthermore, it is to be understood that the specific implementations described herein are for purposes of illustration and explanation only and are not intended to limit the application. In the present disclosure, without stating to the contrary, directional terms as used herein such as "up" and "down" are generally used to refer to the upper and lower parts of the device in its actual use or working condition, specifically the orientation of diagrams in the accompanying drawings; and "inside" and "outside" refer to positions relative to the profile of the device.

An embodiment of the present disclosure provides a light-emitting device and a preparation method thereof. Detailed descriptions are given below. It is to be noted that the order in which the following embodiments are described is not intended to define the preferred order of the embodiments.

According to an embodiment of the present disclosure, there is provided a light-emitting device, which includes a first electrode, a first functional layer, a patterned insulating layer, a patterned second electrode, a patterned second functional layer, and a light-emitting layer. The first functional layer is disposed on the first electrode. The patterned insulating layer is disposed on the first functional layer and at least partially exposes the first functional layer. The patterned second electrode is disposed on the patterned insulating layer, and an orthographic projection of the patterned second electrode on the first functional layer is located within an orthographic projection of the patterned insulating layer corresponding to the patterned second electrode on the first functional layer. The patterned second functional layer covers the patterned second electrode. The light-emitting layer is disposed on the first functional layer and covers the patterned second functional layer and the first functional layer. One of the first electrode and the second electrode is an anode, and another is a cathode. One of the first functional layer and the second functional layer is an electron functional layer, and another is a hole functional layer. The electron functional layer is close to the cathode, and the hole functional layer is close to the anode.

In the present disclosure, when the light-emitting device is an inverted light-emitting device, the first electrode is a first cathode, the first functional layer is a first electron functional layer, the second functional layer is a hole functional layer, and the second electrode is an anode. When the light-emitting device is an upright light-emitting device, the first electrode is a first anode, the first functional layer is a first hole functional layer, the second functional layer is an electron functional layer, and the second electrode is a cathode.

The hole functional layer may include at least one of a hole transport layer or a hole injection layer. The electron functional layer includes at least one of an electron transport layer or an electron injection layer.

In the present disclosure, the orthographic projection of the patterned second electrode on the first functional layer is disposed within the orthographic projection of the patterned insulating layer on the first functional layer, so that the patterned second functional layer is prevented from being in contact with the first functional layer, thereby avoiding a current leakage problem of the light-emitting device, and improving the performance of the light-emitting device.

Detailed description will be given below:

Referring to FIG. 1, it is a schematic diagram of a first structure of a light-emitting device according to an embodiment of the present disclosure. The present disclosure provides a light-emitting device 10, including a first functional layer 100, a patterned insulating layer 200, a patterned second electrode 300, a patterned second functional layer 400, a light-emitting layer 500, and a first electrode 600. The detailed description is provided as follows.

The first electrode 600 is a first cathode or a first anode. The first electrode 600 has a thickness H greater than 100 nm. Specifically, the thickness H of the first electrode 600 may be 100 nm, 110 nm, 250 nm, 700 nm, 900 nm, or the like.

In the present disclosure, the thickness H of the first electrode 600 is set to be greater than 100 nm, so that the conductive performance of the first electrode 600 can be improved.

In an embodiment, the first electrode 600 is a first cathode. A material of the first cathode is a cathode material. The cathode material is selected from one or more of ITO, FTO, Fe, Cu, Al, Sn, Zn, or Ag.

In another embodiment, the first electrode is a first anode. A material of the first anode is an anode material. The anode material is selected from one or more of Pt, Ni, Cu, Ag, Al, or Au.

The first functional layer 100 is disposed on the first electrode 600. The first functional layer 100 has a thickness h of 20 nm to 60 nm. Exemplarily, the thickness h of the first functional layer 100 may be 20 nm, 24 nm, 34 nm, 38 nm, 40 nm, 50 nm, 54 nm, 60 nm, or the like.

In the present disclosure, the thickness h of the first functional layer 100 is set to be 20 nm to 60 nm, thereby ensuring the transport performance and/or injection performance of carriers of the first functional layer 100, and ensuring normal display of the light-emitting device 10.

It is to be noted that the carriers include electrons and holes.

In an embodiment, the first functional layer 100 is a first electron functional layer, and the first electrode 600 is a first cathode. The first electron functional layer is disposed on the first cathode. The first electron functional layer includes at least one of a first electron transport layer or a first electron injection layer. A material of the first electron functional layer is an electron functional layer material. The electron functional layer material is a nanoparticle having a particle size of 5 nm to 20 nm. The electron functional layer material is selected from one or more of $TiO_2$, ZnO, SnO, ZnMgO, AlZnO, ZnSnO, ZrO, AlZnMgO, doped graphene, undoped graphene, $C_{60}$, GaZnO, or ZnMgLiO.

In an embodiment, the first functional layer 100 is a first electron functional layer, and the first electrode 600 is a first cathode. A material of the first electron functional layer is an electron functional layer material. The electron functional layer material is an inorganic metal compound. The inorganic metal compound is selected from one or more of $TiO_2$, ZnO, SnO, ZnMgO, AlZnO, ZnSnO, $CsCO_3$, ZrO, AlZnMgO, GaZnO, or ZnMgLiO.

In the present disclosure, the first functional layer 100 is a first electron functional layer, the first electrode 600 is a first cathode, and the first electron functional layer is formed of an inorganic metal compound to prevent from damage during formation of subsequent other film layers. If an organic compound is used to form the first electron functional layer, it is necessary to apply a light-shielding layer during formation of subsequent film layers, and when the light-shielding layer is required to remove, a part of the first electron functional layer may be removed also, thereby causing damage to the first electron functional layer and affecting the performance of the light-emitting device 10.

In another embodiment, the first functional layer 100 is a first hole functional layer, and the first electrode 600 is a first anode. The first hole functional layer is disposed on the first anode. The first hole functional layer includes at least one of a first hole transport layer and a first hole injection layer. A material of the first hole functional layer is a hole functional layer material. The hole functional layer material is a nanoparticle having a particle size of 5 nm to 20 nm. The hole functional layer material is selected from one or more of nickel oxide, copper oxide, poly(3,4-ethylenedioxythiophene):polystyrene sulfonate, cuprous thiocyanate, polyvinyl carbazole, poly[N,N'-bis(4-butylphenyl)-N,N'-bis(phenyl)benzidine] (Poly-TPD), poly(9,9-dioctylfluorene-co-bis (N,N-phenyl-1,4-phenylenediamine) (PFB), 4,4',4"-tris (carbazol-9-yl)-triphenylamine (TCTA), 4,4'-bis(9-carbazolyl)-biphenyl (CBP), N,N'-diphenyl-N,N'-di(3-methylphenyl)-1,1'-biphenyl-4,4'-diamine (TPD), or N,N'-diphenyl-N,N'-(1-naphthyl)-(1,1'-biphenyl)-4,4'-diamine (NPB).

The patterned insulating layer 200 is disposed on the first functional layer 100. The patterned insulating layer 200 is divided into a plurality of patterned insulating layer sections and a patterned insulating layer connection section connected to the plurality of patterned insulating layer sections. Every two adjacent patterned insulating layer sections are arranged at intervals. That is, the shape of the patterned insulating layer 200 is similar to that of a finger structure. The patterned insulating layer 200 exposes a portion of the first functional layer 100. A material of the patterned insulating layer 200 includes one or more of aluminum oxide, silicon oxide, or silicon oxynitride.

It is to be noted that the finger structure refers to a structure in which a plurality of fingers are connected to a palm.

In an embodiment, the patterned insulating layer 200 has a thickness D of 30 nm to 100 nm. Specifically, the thickness D of the patterned insulating layer 200 may be 30 nm, 34 nm, 44 nm, 58 nm, 70 nm, 80 nm, 94 nm, 100 nm, or the like.

In the present disclosure, the thickness D of the patterned insulating layer 200 is set to 30 nm to 100 nm, thereby avoiding the contact of the subsequent patterned second functional layer 400 with the first functional layer 100, thereby avoiding a current leakage problem of the light-emitting device 10, and ensuring normal display of the light-emitting device 10.

The patterned second electrode 300 is disposed on the patterned insulating layer 200. An orthographic projection of the patterned second electrode 300 on the first functional layer 100 is located within an orthographic projection of the patterned insulating layer 200 corresponding to the patterned second electrode 300 on the first functional layer 100. Specifically, the patterned second electrode 300 is divided into a plurality of patterned second electrode 300 sections and a patterned second electrode 300 connection section connected to the plurality of patterned second electrode 300 sections. That is, a planar shape of the patterned second electrode 300 is similar to that of a finger electrode structure. The patterned second electrode connection section is used for accessing an external circuit. The patterned second electrode 300 sections are disposed in one-to-one correspondence with the patterned insulating layer 200 sections, and the patterned second electrode 300 connection section is disposed in correspondence with the patterned insulating layer 200 connection section. An orthographic projection of each of the patterned second electrode 300 sections on the first functional layer 100 is located within an orthographic projection of corresponding one of the patterned insulating layer 200 sections on the first functional layer 100, and an orthographic projection of the patterned second electrode 300 connection section on the first functional layer 100 is located within an orthographic projection of the patterned insulating layer 200 connection section corresponding to the patterned second electrode 300 connection section on the first functional layer 100.

In an embodiment, the patterned second electrode 300 has a thickness d of 50 nm to 100 nm. Specifically, the thickness d of the patterned second electrode 300 may be 50 nm, 60 nm, 75 nm, 90 nm, 100 nm, or the like.

In the present disclosure, the thickness d of the patterned second electrode 300 is set to be 50 nm to 100 nm so that the patterned second electrode 300 having a thickness within this range has a small resistance and a small current hindering effect, thereby improving the conductive performance of the patterned second electrode 300. If the thickness d of the patterned second electrode 300 is set to be less than 50 nm, the resistance of the patterned second electrode 300 may be excessively large, causing poor conductivity of the light-emitting device 10. If the thickness d of the patterned second electrode 300 is set to be greater than 100 nm, the resistance of the patterned second electrode 300 may be excessively low, causing damage to the light-emitting device 10.

It is to be noted that, the word "corresponding" refers to one film layer is disposed above or below another film layer, for example, the patterned second electrode 300 of the finger structure is disposed above the patterned insulating layer 200 of the finger structure.

In the present disclosure, the orthographic projection of the patterned second electrode 300 on the first functional layer 100 is disposed within the orthographic projection of the patterned insulating layer 200 corresponding to the patterned second electrode 300 on the first functional layer 100, thereby avoiding the contact of the subsequent patterned second functional layer 400 with the first functional layer 100, in turn avoiding the current leakage problem of the light-emitting device 10, and ensuring normal display of the light-emitting device 10.

In an embodiment, a distance between an edge of the orthographic projection of the patterned second electrode 300 on the first functional layer 100 and an edge of the orthographic projection of the patterned insulation layer 200 corresponding to the patterned second electrode 300 on the first functional layer 100 is greater than a range from 20 nm to 105 nm. Specifically, the distance between the edge of the orthographic projection of the patterned second electrode 300 on the first functional layer 100 and the edge of the orthographic projection of the patterned insulation layer 200 corresponding to the patterned second electrode 300 on the first functional layer 100 may be greater than 20 nm, 30 nm, 60 nm, 80 nm, 90 nm, 105 nm, or the like.

In the present disclosure, the distance between the edge of the orthographic projection of the patterned second electrode 300 on the first functional layer 100 and the edge of the orthographic projection of the patterned insulation layer 200 corresponding to the patterned second electrode 300 on the first functional layer 100 is set to be greater than a range from 20 nm to 105 nm, thereby avoiding the contact of the subsequent patterned second functional layer 400 with the first functional layer 100, in turn avoiding the current leakage problem of the light-emitting device 10, and ensuring normal display of the light-emitting device 10.

In an embodiment, the first electrode 600 is a first cathode, the first functional layer 100 is a first electron functional layer, and the patterned second electrode 300 is a second anode (i.e., a patterned second anode). A material of the patterned second anode is an anode material. The anode material is selected from one or more of Pt, Ni, Cu, Ag, Al, or Au.

The conductivity of Ag is $6.3 \times 10^7$ S/m, the conductivity of Al is $3.77 \times 10^7$ S/m, the conductivity of Au is $4.42 \times 10^7$ S/m, and the conductivity of Ni is $1.4 \times 10^7$ S/m. If the patterned second anode is formed by Ag, Al, or Au, the performance of the light-emitting device 10 can be improved because the conductivity of Ag, Al, or Au is greater than that of Ni or Cu.

In another embodiment, the first electrode 600 is a first anode, the first functional layer 100 is a first hole functional layer, and the patterned second electrode 300 is a second cathode (i.e., a patterned second cathode). A material of the patterned second cathode is a cathode material. The cathode material is selected from one or more of ITO, FTO, Fe, Cu, Al, Sn, Zn, or Ag.

The patterned second functional layer 400 is disposed on the patterned second electrode 300 and the patterned insulating layer 200. The patterned second functional layer 400 is divided into a plurality of patterned second functional layer sections and a patterned second functional layer connection section connected to the plurality of patterned second functional layer sections. That is, the planar shape of the patterned second functional layer is that of a finger structure.

In an embodiment, the patterned second functional layer 400 has a thickness E of 15 nm to 100 nm. Specifically, the thickness E of the patterned second functional layer 400 may be 15 nm, 40 nm, 64 nm, 74 nm, 88 nm, 100 nm, or the like.

In the present disclosure, the thickness E of the patterned second functional layer 400 is set to be 15 nm to 100 nm, thereby ensuring the transport efficiency of holes in the patterned hole transport layer, thereby ensuring normal display of the light-emitting device 10. In an embodiment, the patterned second functional 400 sections are disposed in one-to one correspondence with the patterned insulating layer 200 sections. An orthographic projection of each of the patterned second functional layer 400 sections on the first functional layer 100 is located within an orthographic projection of corresponding one of the patterned insulating layer 200 sections on the first functional layer 100, and an orthographic projection of the patterned second functional layer 400 connection section on the first functional layer 100 is located within an orthographic projection of the patterned insulating layer 200 connection section corresponding to the patterned second functional layer 400 connection section on the first functional layer 100. That is, an orthographic projection of the patterned second functional layer 400 on the first functional layer 100 is located within an orthographic projection of the patterned insulating layer 200 corresponding to the patterned second functional layer 400 on the first functional layer 100. In addition, the patterned second functional layer 400 sections are disposed in one-to-one correspondence with the patterned second electrode 300 sections. An orthographic projection of each of the patterned second electrode 300 sections on the patterned insulating layer 200 sections is located within an orthographic projection of corresponding one of the patterned second functional layer 400 sections on the patterned insulating layer 200 sections, and an orthographic projection of the patterned second electrode 300 connection section on the patterned insulating layer 200 connection section is located within an orthographic projection of the patterned second functional layer 400 connection section corresponding to the patterned second electrode 300 connection section on the patterned insulating layer 200 connection section. That is, an orthographic projection of the patterned second electrode 300 on the patterned insulating layer 200 is located within an orthographic projection of the patterned second functional layer 400 corresponding to the patterned second electrode 300 on the patterned insulating layer 200.

In the present disclosure, the orthographic projection of the patterned second functional layer 400 on the first functional layer 100 is disposed within the orthographic projection of the patterned insulating layer 200 on the first functional layer 100, and the orthographic projection of the patterned second electrode 300 on the patterned insulating layer 200 is disposed within the orthographic projection of the patterned second functional layer 400 corresponding to the patterned second electrode 300 on the patterned insulating layer 200, thereby avoiding the contact of the patterned second functional layer 400 with the first functional layer 100, further avoiding the current leakage problem of the light-emitting device 10, and ensuring normal display of the light-emitting device 10.

In an embodiment, a distance W between an edge of the orthographic projection of the patterned second functional layer 400 on the first functional layer 100 and an edge of the orthographic projection of the patterned insulating layer 200 corresponding to the patterned second functional layer 400 on the first functional layer 100 is greater than 5 nm, and a distance between an edge of the orthographic projection of the patterned second electrode 300 on the first functional layer 100 and an edge of the orthographic projection of the patterned insulating layer corresponding to the patterned second electrode 300 on the first functional layer 100 is greater than a range from 20 nm to 105 nm. Specifically, the distance W between the edge of the orthographic projection of the patterned second functional layer 400 on the first functional layer 100 and the edge of the orthographic projection of the patterned insulating layer 200 corresponding to the patterned second functional layer 400 on the first functional layer 100 may be greater than 5 nm, 10 nm, 15 nm, 50 nm, or 100 nm, and the distance between the edge of the orthographic projection of the patterned second electrode 300 on the first functional layer 100 and the edge of the orthographic projection of the patterned insulating layer corresponding to the patterned second electrode 300 on the first functional layer 100 may be greater than 20 nm, 25 nm, 50 nm, 80 nm, 100 nm, or 105 nm.

In the present disclosure, the distance W between the edge of the orthographic projection of the patterned second functional layer 400 on the first functional layer 100 and the edge of the orthographic projection of the patterned insulating layer 200 corresponding to the patterned second functional layer 400 on the first functional layer 100 is set to be greater than 5 nm, and the distance between the edge of the orthographic projection of the patterned second electrode 300 on the first functional layer 100 and the edge of the orthographic projection of the patterned insulating layer 200 corresponding to the patterned second electrode 300 on the first functional layer 100 is set to be greater than a range from 20 nm to 105 nm, thereby avoiding the contact of the patterned second functional layer 400 with the first functional layer 100, in turn avoiding a current leakage problem of the light-emitting device 10, and ensuring normal display of the light-emitting device 10.

In an embodiment, the first electrode 600 is a first cathode, the first functional layer 100 is a first electron functional layer, the patterned second electrode 300 is a patterned second anode, and the patterned second functional layer 400 is a patterned second hole functional layer. The patterned second hole functional layer includes at least one of a patterned second hole transport layer or a patterned second hole injection layer, and a material of the patterned second hole functional layer is a hole functional layer material.

In another embodiment, the first electrode 600 is a first anode, the first functional layer 100 is a first hole functional layer, the patterned second electrode 300 is a patterned second cathode, and the patterned second functional layer 400 is a patterned second electron functional layer. The patterned second electron functional layer includes at least one of a patterned second electron transport layer or a patterned second electron injection layer, and a material of the patterned second electron functional layer is an electron functional layer material.

The light-emitting layer 500 covers the first functional layer 100 and the patterned second functional layer 400 and is in contact with the first functional layer 100 and the second functional layer 400. The light-emitting layer 500 is in electrical contact with the first functional layer 100 and the patterned second functional layer 400. The light-emitting layer 500 may be a quantum dot light-emitting layer. The light-emitting layer 500 includes a red quantum dot light-emitting layer, a blue quantum dot light-emitting layer, and a green light-emitting layer.

A material of the light-emitting layer 500 is a quantum dot material known in the art for a quantum dot light-emitting layer of an optoelectronic device. The material of the light-emitting layer 500 includes at least one of a single-structural quantum dot or a core-shell structural quantum dot. The single-structural quantum dot includes at least one of a group II-VI compound, a group III-V compound, or a group I-III-VI compound. The core-shell structural quantum dot has a core-shell structure in which a shell layer coats a core layer, and a band gap of the shell layer of the quantum dot is greater than that of the core layer. For example, the group II-VI compound includes at least one of CdSe, CdS, CdTe, ZnSe, ZnS, CdTe, ZnTe, CdZnS, CdZnSe, CdZnTe, ZnSeS, ZnSeTe, ZnTeS, CdSeS, CdSeTe, CdTeS, CdZnSeS, CdZnSeTe, or CdZnSTe. The group III-V compound includes at least one of InP, InAs, GaP, GaAs, GaSb, AlN, AlP, InAsP, InNP, InNSb, GaAlNP, or InAlNP. The group I-III-VI compound includes at least one of CuInS$_2$, CuInSe$_2$, or AgInS$_2$. The core layer of the core-shell structural quantum dot includes at least one of the above-described single-structural quantum dots, and the shell layer of the core-shell structural quantum dot includes at least one of CdS, CdTe, CdSeTe, CdZnSe, CdZnS, CdSeS, ZnSe, ZnSeS, or ZnS. As an example, the core-shell structural quantum dot includes at least one of CdZnSe/CdZnS/ZnS, CdZnSe/ZnSe/ZnS, CdSe/ZnS, CdSe/ZnSe/ZnS, ZnSe/ZnS, ZnSeTe/ZnS, CdSe/CdZnSeS/ZnS, InP/ZnSe/ZnS, or InP/ZnSeS/ZnS.

In the present disclosure, the material of the light-emitting layer 500 is a core-shell structural quantum dot material, and the band gap of the shell layer is greater than that of the core layer, so that the light-emitting layer 500 may expand the range of spectrums collected by photons, while the influence of defects of the core layer on the light emission of the light-emitting layer 500 can be avoided. When the material of the light-emitting layer 500 has the core-shell structure in which the shell layer coates the core layer, the thickness of the shell layer can be adjusted to avoid the influence on the coupling characteristics of the core layer, thereby improving the light-emitting effect of the light-emitting device 10 and improving the stability of the display of the light-emitting device 10.

In the present disclosure, other film layers of the light-emitting device 10 are first formed, followed by the light-emitting layer 500, thereby avoiding damage to the light-emitting layer 500 during deposition of other film layer materials, and avoiding that the fluorescence of the light-emitting layer 500 may be shielded by other film layers due to the fact that the light-emitting layer 500 is wrapped within other film layers of the light-emitting device 10, improving the display effect of the light-emitting device 10 and improving the performance of the light-emitting device 10.

In an embodiment, the light-emitting device 10 further includes an encapsulation structure. The encapsulation structure is disposed on the light-emitting layer 500. The encapsulation structure is formed by alternately stacking an inorganic layer(s) and an organic layer(s). Providing the encapsulation structure on the light-emitting layer 500 prevents the light-emitting layer 500 from being eroded by water and oxygen, thereby improving the performance of the light-emitting device 10.

Exemplary Embodiment 1

The light-emitting device 10 is an inverted light-emitting device, in which the first electrode 600 is a first cathode, the first functional layer 100 is a first electron functional layer, the patterned second functional layer 400 is a patterned second hole functional layer, and the patterned second electrode 300 is a patterned second anode. The first electron functional layer is disposed on the first cathode, a material of the first cathode is a cathode material, and a material of the first electron functional layer is an electron functional layer material. The patterned insulating layer 200 is disposed on the first electron functional layer and exposes a part of the first electron functional layer. The patterned second anode is disposed on the patterned insulating layer 200, and the orthographic projection of the patterned second anode on the first electron functional layer is located within the orthographic projection of the patterned insulating layer 200 corresponding to the patterned second anode on the first electron functional layer. The material of the patterned second anode is an anode material. The patterned second hole functional layer is disposed on the patterned insulating layer 200 and the patterned second anode, the orthographic projection of the patterned second hole functional layer on the first electron functional layer is located within the orthographic projection of the patterned insulating layer 200 corresponding to the patterned second hole functional layer on the first electron functional layer, and the orthographic projection of the patterned second anode on the patterned insulating layer 200 is located within the orthographic projection of the patterned second hole functional layer corresponding to the patterned second anode on the patterned insulating layer 200. The material of the patterned second hole functional layer is a hole functional layer material. The light-emitting layer 500 is disposed on the first electron functional layer, the patterned insulating layer 200, and the patterned second hole transport layer, and is in electrical contact with the first electron functional layer and the patterned second hole transport layer. The encapsulation structure is disposed on the light-emitting layer 500.

In the present disclosure, the orthographic projection of the patterned second anode on the first electron functional layer is disposed within the orthographic projection of the patterned insulating layer 200 on the first electron functional layer, so as to avoid the contact of the patterned second hole functional layer with the first electron functional layer, and to avoid the current leakage problem of the light-emitting device 10, thereby improving the performance of the light-emitting device 10. In addition, other film layers of the light-emitting device 10 are formed first, followed by the light-emitting layer 500, so as to avoid damage to the light-emitting layer 500 during deposition of other film layer materials, and to avoid that the fluorescence of the light-emitting layer 500 may be shielded by other film layers due to the fact that the light-emitting layer 500 is wrapped within other film layers of the light-emitting device 10, thereby improving the display effect of the light-emitting device 10 and improving the performance of the light-emitting device 10.

Exemplary Embodiment 2

Refer still to FIG. 1.

It is to be noted that Exemplary embodiment 2 differs from Exemplary embodiment 1 in the following ways:

The light-emitting device 10 is an upright light-emitting device, in which the first electrode 600 is a first anode, the patterned second electrode 300 is a patterned second cathode, the first functional layer 100 is a first hole functional layer, and the patterned second functional layer is a patterned second electron functional layer.

Specifically, the first hole functional layer is disposed on the first anode, the material of the first anode is an anode material, and the material of the first hole functional layer is a hole functional layer material. The patterned insulating layer 200 is disposed on the first hole functional layer and exposes a portion of the first electron functional layer. The patterned second cathode is disposed on the patterned insulating layer 200, and the orthographic projection of the patterned second cathode on the first hole functional layer is disposed within the orthographic projection of the patterned insulating layer 200 corresponding to the patterned second cathode on the first hole functional layer. The material of the patterned second cathode is a cathode material. The patterned second electron functional layer is disposed on the patterned insulating layer 200 and the patterned second cathode, the orthographic projection of the patterned second electron functional layer on the first hole functional layer is located within the orthographic projection of the patterned insulating layer 200 corresponding to the patterned second electron functional layer on the first hole functional layer, and the orthographic projection of the patterned second cathode on the patterned insulating layer 200 is located within the orthographic projection of the patterned second electron functional layer corresponding to the patterned second cathode on the patterned insulating layer 200, and a material of the patterned second electron functional layer is an electron functional layer material. The light-emitting layer 500 is disposed on the first hole functional layer, the patterned insulating layer 200, and the patterned second electron transport layer, and is in electrical contact with the first hole functional layer and the patterned second electron transport layer. The encapsulation structure is provided on the light-emitting layer 500.

In the present disclosure, the orthographic projection of the patterned second cathode on the first hole functional layer is disposed within the orthographic projection of the patterned insulating layer 200 on the first hole functional layer, so as to avoid the contact of the patterned second electron functional layer with the first hole functional layer, and to avoid the current leakage problem of the light-emitting device 10, thereby improving the performance of the light-emitting device 10. In addition, other film layers of the light-emitting device 10 are formed first, followed by the light-emitting layer 500, so as to avoid damage to the light-emitting layer 500 during deposition of other film layer materials, and to avoid that the fluorescence of the light-emitting layer 500 may be shielded by other film layers due to the fact that the light-emitting layer 500 is wrapped within other film layers of the light-emitting device 10, thereby improving the display effect of the light-emitting device 10 and improving the performance of the light-emitting device 10. Other structures are same as those of Exemplary embodiment 1, and details are not repeated herein.

Exemplary Embodiment 3

An embodiment of the present disclosure also provides a second structure of the light-emitting device. It is to be noted that Exemplary embodiment 3 differs from Exemplary embodiment 1 in that the light-emitting device further includes a third functional layer and a third electrode. The third functional layer is disposed on the light-emitting layer, and the third electrode is disposed on the third functional layer. In the present disclosure, the third functional layer may be an electron functional layer, and the third electrode may be a cathode. Alternatively, the third functional layer may be a hole functional layer, and the third electrode may be an anode. When the light-emitting device is an upright light-emitting device, the first electrode is a first anode, the first functional layer is a first hole functional layer, the second functional layer is a second electron functional layer, the second electrode is a second cathode, the third functional layer is a third hole functional layer, and the third electrode is a third anode. When the light-emitting device is an inverted light-emitting device, the first electrode is a first cathode, the first functional layer is a first electron functional layer, the second functional layer is a second hole functional layer, the second electrode is a second anode, the third functional layer is a third electron functional layer, and the third electrode is a third cathode.

Figure 2:
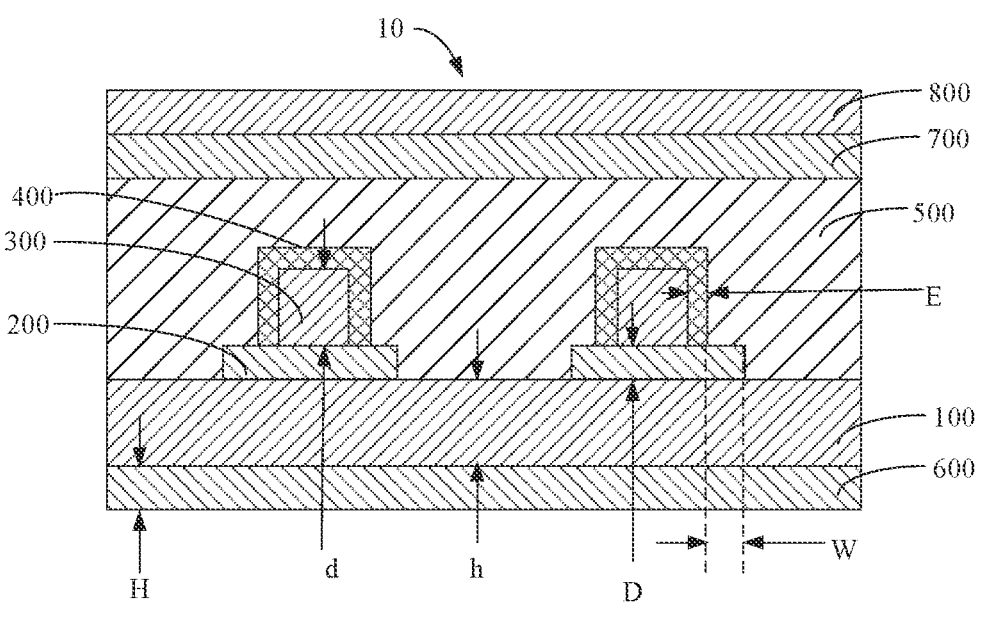
FIG. 2 is a schematic diagram of a second structure of a light-emitting device according to some embodiments of the present disclosure.

An embodiment may refer to FIG. 2. FIG. 2 is a schematic diagram of a second structure of a light-emitting device according to an embodiment of the present disclosure.

The light-emitting device is an inverted light-emitting device, in which the third functional layer 700 is a third electron functional layer, and the third electrode 800 is a third cathode. The third electron transport layer 700 and the third electrode 800 are stacked on the light-emitting layer 500 in this order. In this case, it is preferable that the light-emitting layer 500 is a blue quantum dot light-emitting layer. Since electrons in the blue quantum dot light-emitting device 10 are minority carriers (i.e., the number of electrons is less than the number of holes), the addition of the third electron functional layer and the third electrode 800 can improve injection of electrons, balance the electrons and holes, and improve efficiency of the device. Other structures are same as those of Exemplary embodiment 1, and details are not repeated herein.

In an embodiment, a material of the third electron functional layer is an electron functional layer material, which includes an inorganic metal compound or an organic metal compound.

In an embodiment, the electron functional layer material includes one or more of $TiO_2$, ZnO, SnO, ZnMgO, AlZnO, ZnSnO, $CsCO_3$, ZrO, AlZnMgO, GaZnO, or ZnMgLiO.

In an embodiment, a material of the third cathode is a cathode material, which includes one or more of Ag, Al, or Au.

In the present disclosure, the third electron functional layer as the third functional layer 700 and the third cathode as the third electrode 800 are disposed on the light-emitting layer 500, so as to increase the effective contact area between the electron functional layer and the light-emitting layer 500, that is, the effective contact area between the first and third electron functional layers and the light-emitting layer 500, to improve the electron transport efficiency of the light-emitting device 10, to balance the hole transport efficiency and the electron transport efficiency of the light-emitting device 10, thereby facilitating the balance of charges inside the light-emitting device 10, and improving the performance of the device.

Exemplary Embodiment 4

Referring still to FIG. 2, it is to be noted that Exemplary embodiment 4 differs from Exemplary embodiment 2 in that the light-emitting device further includes a third functional layer and a third electrode. The third functional layer is provided on the light-emitting layer, and the third electrode is provided on the third functional layer. In the present disclosure, the third functional layer may be an electron functional layer, and the third electrode may be a cathode. Alternatively, the third functional layer may be a hole functional layer, and the third electrode may be an anode. When the light-emitting device is an upright light-emitting device, the first electrode is a first anode, the first functional layer is a first hole functional layer, the second functional layer is a second electron functional layer, the second electrode is a second cathode, the third functional layer is a third hole functional layer, and the third electrode is a third anode. When the light-emitting device is an inverted light-emitting device, the first electrode is a first cathode, the first functional layer is a first electron functional layer, the second functional layer is a second hole functional layer, the second electrode is a second anode, the third functional layer is a third electron functional layer, and the third electrode is a third cathode.

An embodiment may refer to FIG. 2. FIG. 2 is a schematic diagram of a second structure of a light-emitting device according to an embodiment of the present disclosure.

The light-emitting device 10 is an upright light-emitting device, in which the third functional layer 700 is a third hole functional layer, a material of the third hole functional layer is a hole functional layer material, the third electrode 800 is a third anode, and a material of the third anode is an anode material. In this case, it is preferable that the light-emitting layer 500 is a red quantum dot light-emitting layer. Since electrons in the red quantum dot device are majority carriers (i.e., the number of electrons is greater than the number of holes), the addition of the third hole functional layer as the third functional layer and the third anode as third electrode can improve injection of holes, balance the electrons and holes, and improve efficiency of the light-emitting device 10. Other structures are same as those of Exemplary embodiment 2, and details are not repeated herein.

In the present disclosure, the third hole functional layer as the third functional layer 700 and the third anode as the third electrode 800 are disposed on the light-emitting layer 500, so as to increase the effective contact area between the hole functional layer and the light-emitting layer 500, that is, the effective contact area between the first and third hole functional layers and the light-emitting layer 500, to improve the hole transport efficiency of the light-emitting device 10, and to balance the holes and the electrons of the light-emitting device 10, thereby facilitating to balance charges inside the light-emitting device 10, and improving the performance of the device.

An embodiment of the present disclosure provides a light-emitting device 10, in which the orthographic projection of the patterned second electrode 300 on the first functional layer 100 is disposed within the orthographic projection of the patterned insulating layer 200 on the first functional layer 100, so as to avoid the contact of the patterned second functional layer 400 with the first functional layer 100, and to avoid the current leakage problem of the light-emitting device 10, thereby improving the performance of the light-emitting device 10. In addition, other film layers of the light-emitting device 10 are formed first, followed by the light-emitting layer 500, so as to avoid the damage to the light-emitting layer 500 during deposition of other film layer materials, and to avoid that the fluorescence of the light-emitting layer 500 may be shielded by other film layers due to the fact that the light-emitting layer 500 is wrapped within other film layers of the light-emitting device 10, thereby improving the display effect of the light-emitting device 10 and improving the performance of the light-emitting device 10. The third functional layer 700 and the third electrode 800 are provided on the light-emitting layer 500, so as to increase the effective contact area between the functional layer and the light-emitting layer 500, that is, the effective contact area between the first and third hole functional layers 100 and 700 and the light-emitting layer 500, to improve the transport efficiency of carriers of the light-emitting device 10, and to balance the holes and the electrons, thereby facilitating to balance the charges inside the light-emitting device 10, and improving the performance of the device.

The present disclosure further provides a method of manufacturing a light-emitting device, including the following steps:

B11. providing a first electrode;

B12. forming a first functional layer on the first electrode;

B13. forming a patterned insulating layer on the first functional layer, the patterned insulating layer at least partially exposing the first functional layer;

B14. forming a patterned second electrode on the patterned insulating layer, wherein an orthographic projection of the patterned second electrode on the first functional layer is located within an orthographic projection of the patterned insulating layer corresponding to the patterned second electrode on the first functional layer;

B15. forming a patterned second functional layer on the patterned second electrode;

B16. forming a light-emitting layer on the first functional layer and the patterned second functional layer.

One of the first electrode and the second electrode is an anode, and another is a cathode. One of the first functional layer and the second functional layer is an electron functional layer, and another is a hole functional layer. The electron functional layer is close to the cathode, and the hole functional layer is close to the anode.

In the present application, the orthographic projection of the patterned second electrode on the first functional layer is set to be located within the orthographic projection of the patterned insulating layer on the first functional layer, so as to avoid the contact of the patterned second functional layer with the first functional layer, and to avoid a current leakage problem of the light-emitting device and improve the performance of the light-emitting device.

Specific Descriptions are Provided Below:

Referring to FIGS. 1 and 3, FIG. 3 is a flowchart of a method of manufacturing a light-emitting device according to an embodiment of the present application. The method of manufacturing the light-emitting device comprises the following steps:

B11. Providing the first electrode.

The first electrode 600 may be a first cathode or a first anode. The first electrode 600 has a thickness H greater than 100 nm. Specifically, the thickness H of the first electrode 600 may be 100 nm, 110 nm, 250 nm, 700 nm, 900 nm, or the like.

In an embodiment, the first electrode 600 is a first cathode. A material of the first cathode is a cathode material selected from one or more of ITO, FTO, Fe, Cu, Al, Sn, Zn, or Ag.

In another embodiment, the first electrode is a first anode. A material of the first anode is an anode material selected from one or more of Pt, Ni, Cu, Ag, Al, or Au.

B12. Forming the first functional layer on the first electrode.

30 mg/mL of nanoparticles of the first functional layer 100 is spin-coated on the first electrode 600 at a spin-coating speed of 3000 rpm for 30 seconds, and then heated at 80 degrees Celsius for 30 minutes to form the first functional layer 100.

In an embodiment, the first functional layer 100 has a thickness h of 20 nm to 60 nm. Specifically, the thickness h of the first electron transport layer may be 20 nm, 24 nm, 34 nm, 38 nm, 40 nm, 50 nm, 54 nm, 60 nm, or the like.

In an embodiment, the first electrode 600 is a first cathode, and the first functional layer is a first electron functional layer. The first electron functional layer includes at least one of a first electron transport layer or a first electron injection layer. A material of the first electron functional layer is an electron functional layer material. The electron functional layer material is selected from one or more of $TiO_2$, ZnO, SnO, ZnMgO, AlZnO, ZnSnO, ZrO, AlZnMgO, doped graphene, undoped graphene, $C_{60}$, GaZnO, or ZnMgLiO.

In another embodiment, the first electrode 600 is a first anode, and the first functional layer is a first hole functional layer. The first hole functional layer includes at least one of a first hole transport layer and a first hole injection layer. A material of the first hole functional layer is a hole functional layer material. The hole functional layer material is selected from one or more of nickel oxide, copper oxide, poly(3,4-ethylenedioxythiophene):polystyrene sulfonate (PEDOT: PSS), cuprous thiocyanate, polyvinyl carbazole, poly[N,N'-bis(4-butylphenyl)-N,N'-bis(phenyl)benzidine] (Poly-TPD), poly(9,9-dioctylfluorene-co-bis(N,N-phenyl-1,4-phenylenediamine) (PFB), 4,4',4''-tris(carbazol-9-yl)-triphenylamine (TCTA), 4,4'-bis(9-carbazolyl)-biphenyl (CBP), N,N'-diphenyl-N,N'-di(3-methylphenyl)-1,1'-biphenyl-4,4'-diamine (TPD), or N,N'-diphenyl-N,N'-(1-naphthyl)-(1,1'-biphenyl)-4,4'-diamine (NPB).

B13. Forming the patterned insulating layer on the first functional layer, the patterned insulating layer at least partially exposing the first functional layer.

A first light-shielding layer having a plurality of through-holes is formed on the first functional layer, and the through-holes extend through the first light-shielding layer to expose a portion of the first functional layer. The patterned insulating layer is formed in the through-holes, and then the first light-shielding layer is removed.

An Embodiment is Provided as Follows:

A material of the first light-shielding layer is spin-coated on the first functional layer 100 in a yellow light clean room at a spin-coating speed of 3000 rpm for 30 seconds, and then heat-treated at 110 degrees Celsius for 2 minutes.

Then, the material of the first light-shielding layer is exposed to an ultraviolet lamp using a first photolithographic mask for 5 seconds.

Then, the material of the first light-shielding layer is developed in AZ726 developing solution (3:1 to water) for 25 seconds to form the first light-shielding layer having the plurality of through-holes. The first light-shielding layer is an AZ1512 light-shielding layer. The through-holes extend through the first light-shielding layer to expose a portion of the first functional layer 100. The through-holes are disposed above the first functional layer 100.

Then, a material of the patterned insulating layer is evaporated in the through-holes by electron beam under a vacuum degree of $3\times10^{-4}$ Pa at an evaporation deposition rate of 1 angstrom/second for 300 seconds to reach to a deposition thickness of 30 nm, thereby obtaining the patterned insulating layer 200.

Then, the first electrode 600, the first functional layer 100, and the patterned insulating layer 200 are soaked into acetone, and the first light-shielding layer is ultrasonically removed.

The patterned insulating layer 200 is divided into a plurality of patterned insulating layer sections and a patterned insulating layer connection section connected to the plurality of patterned insulating layer sections. Every two adjacent patterned insulating layer sections are arranged at intervals. That is, a shape of the patterned insulating layer 200 is similar to that of a finger structure. The patterned insulating layer 200 exposes a portion of the first functional layer 100. The material of the patterned insulating layer 200 includes one or more of aluminum oxide, silicon oxide, or silicon oxynitride.

The patterned insulating layer 200 has a thickness D of 30 nm to 100 nm. Specifically, the thickness D of the patterned insulating layer 200 may be 30 nm, 34 nm, 44 nm, 58 nm, 70 nm, 80 nm, 94 nm, 100 nm, or the like.

In the present disclosure, the thickness D of the patterned insulating layer 200 is set to 30 nm to 100 nm, so as to avoid the contact of a subsequent patterned second functional layer 400 with the first functional layer 100, thereby avoiding a current leakage problem of the light-emitting device 10, and ensuring normal display of the light-emitting device 10.

B14. Forming the patterned second electrode on the patterned insulating layer, wherein an orthographic projection of the patterned second electrode on the first functional layer is located within an orthographic projection of the patterned insulating layer corresponding to the patterned second electrode on the first functional layer.

A second light-shielding layer having a plurality of via holes is formed on the first functional layer and the patterned insulating layer, and the via holes correspond to the patterned insulating layer and extend through the second light-shielding layer to expose a portion of the patterned insulating layer. The patterned second electrode is formed in the via holes such that the orthographic projection of the patterned second electrode on the first functional layer is located within the orthographic projection of the patterned insulating layer on the first functional layer.

An Embodiment is Provided as Follows:

The first electrode 600, the first functional layer 100, and the patterned insulating layer 200 are dried, and then a material of the second light-shielding layer is spin-coated on the first functional layer 100 and the patterned insulating layer 200 at a spin-coating speed of 3000 rpm for 30 seconds, and heat-treated at 110° C. for 2 minutes.

Then, the material of the second light-shielding layer is exposed to an ultraviolet lamp using a second photolithographic mask for 5 seconds.

Then, the material of the second light-shielding layer is developed in AZ726 developing solution (3:1 to water) for 25 seconds to form the second light-shielding layer having the plurality of via holes. The via holes extend through the second light-shielding layer to expose a portion of the patterned insulating layer 200. The via holes are correspondingly disposed in the second light-shielding layer. The second light-shielding layer is a AZ1512 light-shielding layer.

Then, a material of the patterned second electrode 300 is deposited in the via holes by electron beam under a vacuum degree of $3\times10^{-4}$ Pa at an evaporation deposition rate of 1 angstrom/second for 900 seconds to reach to a deposition thickness of 90 nm, thereby obtaining the patterned second electrode 300. The patterned second electrode 300 is divided into a plurality of patterned second electrode 300 sections and a patterned second electrode 300 connection section connected to the plurality of patterned second electrode 300 sections. That is, a planar shape of the patterned second electrode 300 is similar to that of a finger electrode. The patterned second electrode connection section is used for accessing an external circuit. The patterned second electrode 300 sections are provided in one-to-one correspondence with the patterned insulating layer 200 sections, and the patterned second electrode 300 connection section is provided in correspondence with the patterned insulating layer 200 connection section. The orthographic projection of each of the patterned second electrode 300 sections on the first functional layer 100 is located within the orthographic projection of corresponding one of the patterned insulating layer 200 sections on the first functional layer 100, and the orthographic projection of the patterned second electrode 300 connection section on the first functional layer 100 is located within the orthographic projection of the patterned insulating layer 200 connection section corresponding to the patterned second electrode 300 connection section on the first functional layer 100. That is, the orthographic projection of the patterned second electrode 300 on the first functional layer 100 is located within the orthographic projection of the patterned insulating layer 200 on the first functional layer 100.

In an embodiment, a distance between an edge of the orthographic projection of the patterned second electrode 300 on the first functional layer 100 and an edge of the orthographic projection of the patterned insulation layer 200 corresponding to the patterned second electrode 300 on the first functional layer 100 is greater than a range from 20 nm to 105 nm. Specifically, the distance between the edge of the orthographic projection of the patterned second electrode 300 on the first functional layer 100 and the edge of the orthographic projection of the patterned insulation layer 200 corresponding to the patterned second electrode 300 on the first functional layer 100 may be greater than 20 nm, 30 nm, 60 nm, 80 nm, 90 nm, 105 nm, or the like.

In the present disclosure, the distance between the edge of the orthographic projection of the patterned second electrode 300 on the first functional layer 100 and the edge of the orthographic projection of the patterned insulation layer 200 corresponding to the patterned second electrode 300 on the first functional layer 100 is set to be greater than a range from 20 nm to 105 nm, so as to avoid the contact of the subsequent patterned second functional layer 400 with the first functional layer 100, thereby avoiding the current leakage problem of the light-emitting device 10, and ensuring normal display of the light-emitting device 10.

In an embodiment, when the patterned second electrode is a patterned second anode, the material of the patterned second electrode 300 is an anode material selected from one or two of Ag, Al, Pt, Au, Ni, or Cu.

In another embodiment, when the patterned second electrode is a patterned second cathode, the material of the patterned second electrode 300 is a cathode material selected from one or two of Ti, ITO, FTO, Fe, Al, Sn, Zn, Ag, Ni, or Cu.

B15. Forming the patterned second functional layer on the patterned second electrode.

There are two methods of forming the patterned second functional layer on the patterned second electrode.

In the first method, the second light-shielding layer is removed, and then the patterned second electrode is subjected to an oxidation process to form the patterned second functional layer on the surface of the patterned second electrode. An orthographic projection of the patterned second functional layer on the first functional layer is located within the orthographic projection of the patterned insulating layer on the first functional layer.

An Embodiment is Provided as Follows:

The first electrode 600, the first functional layer 100, the patterned insulating layer 200, the patterned second electrode 300, and the second light-shielding layer are soaked into acetone, and the second light-shielding layer is ultrasonically removed. Then, the first electrode 600, the first functional layer 100, the patterned insulating layer 200, and the patterned second electrode 300 are placed on a hot plate for heat treatment. That is, the surface of the patterned second electrode 300 is subjected to oxidation treatment to form the patterned second functional layer 400. The heat treatment is carried out at 300 degrees Celsius for 30 minutes. The orthographic projection of the patterned second functional layer 400 on the first functional layer 100 is located within the orthographic projection of the patterned insulating layer on the first functional layer 100. The patterned second functional layer 400 is divided into a plurality of patterned second functional layer sections and a patterned second functional layer connection section connected to the plurality of patterned second functional layer sections. That is, a planar shape of the patterned second functional layer is that of a finger structure.

In an embodiment, the patterned second functional 400 sections are disposed in one-to one correspondence with the patterned insulating layer 200 sections. The orthographic projection of each of patterned second functional layer 400 sections on the first functional layer 100 is located within the orthographic projection of corresponding one of the patterned insulating layer 200 sections on the first functional layer 100, and the orthographic projection of the patterned second functional layer 400 connection section on the first functional layer 100 is located within the orthographic projection of the patterned insulating layer 200 connection section corresponding to the patterned second functional layer 400 connection section on the first functional layer 100. That is, the orthographic projection of the patterned second functional layer 400 on the first functional layer 100 is located within the orthographic projection of the patterned insulating layer 200 corresponding to the patterned second functional layer 400 on the first functional layer 100. In addition, the patterned second functional layer 400 sections are disposed in one-to-one correspondence with the patterned second electrode 300 sections. The orthographic projection of each of the patterned second electrode 300 sections on the patterned insulating layer 200 sections is located within the orthographic projection of corresponding one of the patterned second functional layer 400 sections on the patterned insulating layer 200 sections, and the orthographic projection of the patterned second electrode 300 connection section on the patterned insulating layer 200 connection section is located within the orthographic projection of the patterned second functional layer 400 connection section corresponding to the patterned second electrode 300 connection section on the patterned insulating layer 200 connection section. That is, the orthographic projection of the patterned second electrode 300 on the patterned insulating layer 200 is located within the orthographic projection of the patterned second functional layer 400 corresponding to the patterned second electrode 300 on the patterned insulating layer 200.

In an embodiment, the material of the patterned second electrode 300 is a conductive material, and the material of the patterned second functional layer 400 is an oxide of the conductive material.

In an embodiment, when the patterned second electrode 300 is a patterned second cathode, the patterned second functional layer is a patterned second electron functional layer. A material of the patterned second cathode is a cathode material selected from one or two of Ti, Zn, or Sn. A material of the patterned second electron functional layer is an electron functional layer material selected from one or two of $TiO_2$, ZnO, or $SnO_2$.

In another embodiment, when the patterned second electrode 300 is a patterned second anode, and the patterned second functional layer is a patterned second hole functional layer. The patterned second hole functional layer includes at least one of a patterned second hole transport layer and a patterned second hole injection layer. The material of the patterned second electrode 300 is an anode material selected from one or two of Ni or Cu. A material of the patterned second hole functional layer is a hole functional layer material selected from one or two of nickel oxide or copper oxide.

In the second method, the material of the patterned second functional layer is deposited on the patterned insulating layer and the patterned second electrode to form the patterned second functional layer, wherein the orthographic projection of the patterned second functional layer on the first functional layer is located within the orthographic projection of the patterned insulating layer on the first functional layer. Then, the second light-shielding layer is removed.

An Embodiment is Provided as Follows:

The patterned second functional layer is formed on the patterned second electrode 300 using an electrochemical deposition method or an evaporation method. The detailed description is as follows:

Formation of the patterned second functional layer 400 using the electrochemical deposition method: the first electrode 600, the first functional layer 100, the patterned insulating layer 200, and the patterned second electrode 300 are placed in an aqueous solution of the material of the second functional layer at a concentration of 0.1 mole per liter, and a voltage of 1.1 volts is applied to the patterned second electrode 300 for 120 seconds using a saturated calomel electrode as a reference electrode to form the patterned second functional layer 400. Then, the second light-shielding layer is removed.

Formation of the patterned second functional layer using the evaporation method: the material of the second functional layer is evaporated on the patterned second electrode 300 and the patterned insulating layer 200 to form the patterned second functional layer. Then, the second light-shielding layer is removed.

In an embodiment, when the patterned second electrode 300 is a patterned second anode, the patterned second functional layer 400 is a patterned second hole functional layer. The material of the patterned second anode 300 is an anode material selected from one or more of Pt, Ni, Cu, Ag, Al, or Au. The material of the patterned second hole functional layer is a hole functional layer material selected from one or more of nickel oxide, copper oxide, poly(3,4-ethylenedioxythiophene):polystyrene sulfonate, cuprous thiocyanate, polyvinyl carbazole, poly[N,N'-bis(4-butylphenyl)-N,N'-bis(phenyl)benzidine] (Poly-TPD), poly(9,9-dioctylfluorene-co-bis(N,N-phenyl-1,4-phenylenediamine) (PFB), 4,4',4"-tris(carbazol-9-yl)-triphenylamine (TCTA), 4,4'-bis(9-carbazolyl)-biphenyl (CBP), N,N'-diphenyl-N,N'-di(3-methylphenyl)-1,1'-biphenyl-4,4'-diamine (TPD), or N,N'-diphenyl-N,N'-(1-naphthyl)-(1,1'-biphenyl)-4,4'-diamine (NPB).

In another embodiment, when the patterned second electrode 300 is a patterned second cathode, the patterned second functional layer 400 is a patterned second electron functional layer. The material of the patterned second cathode is a cathode material selected from one or more of ITO, FTO, Fe, Cu, Al, Sn, Zn, or Ag. The material of the patterned second electron functional layer is an electron functional layer material selected from one or more of $TiO_2$, ZnO, SnO, ZnMgO, AlZnO, ZnSnO, ZrO, AlZnMgO, Li-doped $TiO_2$, Ru-doped $TiO_2$, doped graphene, undoped graphene, $C_{60}$, GaZnO, or ZnMgLiO.

B16. Forming the light-emitting layer on the first functional layer and the patterned second functional layer.

20 mg/mL of a material of the light-emitting layer 500 is spin-coated on the first functional layer 100 and the patterned second functional layer 400 at a spin-coating speed of 2000 rpm for 30 seconds to form the light-emitting layer 500. The light-emitting layer 500 includes a red light-emitting layer, a green light-emitting layer, and a blue light-emitting layer.

The material of the light-emitting layer 500 is a quantum dot material known in the art for a quantum dot light-emitting layer of an optoelectronic device. The material of the light-emitting layer 500 includes at least one of a single-structural quantum dot or a core-shell structural quantum dot. The single-structural quantum dot includes at least one of a group II-VI compound, a group III-V compound, or a group I-II-VI compound. The core-shell structural quantum dot has a core-shell structure in which a shell layer coats a core layer, and a band gap of the shell layer of the quantum dot is greater than that of the core layer thereof. For example, the group II-VI compound includes at least one of CdSe, CdS, CdTe, ZnSe, ZnS, CdTe, ZnTe, CdZnS, CdZnSe, CdZnTe, ZnSeS, ZnSeTe, ZnTeS, CdSeS, CdSeTe, CdTeS, CdZnSeS, CdZnSeTe, or CdZnSTe. The group III-V compound includes at least one of InP, InAs, GaP, GaAs, GaSb, AlN, AlP, InAsP, InNP, InNSb, GaAlNP, or InAlNP. The group I-III-VI compound includes at least one of $CuInS_2$, $CuInSe_2$, or $AgInS_2$. The core layer of the core-shell structural quantum dot includes at least one of the above-described single-structural quantum dots, and the shell layer of the core-shell structural quantum dot includes at least one of CdS, CdTe, CdSeTe, CdZnSe, CdZnS, CdSeS, ZnSe, ZnSeS, or ZnS. As an example, the core-shell structural quantum dot includes at least one of CdZnSe/CdZnS/ZnS, CdZnSe/ZnSe/ZnS, CdSe/ZnS, CdSe/ZnSe/ZnS, ZnSe/ZnS, ZnSeTe/ZnS, CdSe/CdZnSeS/ZnS, InP/ZnSe/ZnS, or InP/ZnSeS/ZnS.

In an embodiment, the method further includes other steps after step B16 as follows:

An encapsulation structure is formed on the light-emitting layer 500. The encapsulation structure is formed by alternately stacking an inorganic layer(s) and an organic layer(s). Providing the encapsulation structure in the light-emitting device 10 prevents the light-emitting layer 500 from being eroded by water and oxygen, thereby improving the performance of the light-emitting device 10.

Then, the current, voltage and luminance data of the light-emitting device 10 are tested to determine the electrical performance of the device;

Then, the operating life data of the light-emitting device 10 is tested using a constant current drive of 2 mA, so as to determine the operating life of the light-emitting device 10.

Example 1

The first electrode 600 is a first cathode, the first functional layer is a first electron functional layer, the patterned second electrode 300 is a patterned second anode, and the patterned second functional layer is a patterned second hole functional layer. That is, the light-emitting device is an inverted light-emitting device.

B11. Providing the first electrode.

B12. Forming the first functional layer on the first electrode.

Specifically, ZnO nanoparticles having a concentration of 30 mg/mL and a particle size of 10 nm are spin-coated on the first cathode at a spin-coating speed of 3000 rpm for 30 seconds, and then heated at 80 degrees Celsius for 30 minutes to form the first electron transport layer having a thickness h of 10 nm as the first electron functional layer.

B13. Forming the patterned insulating layer on the first functional layer, the patterned insulating layer at least partially exposing the first functional layer.

Specifically, a material of the first light-shielding layer is spin-coated on the first electron transport layer in a yellow light clean room at a spin-coating speed of 3000 rpm for 30 seconds, and then heat-treated at 110 degrees Celsius for 2 minutes. Then, the material of the first light-shielding layer is exposed to an ultraviolet lamp using a first photolithographic mask for 5 seconds, then developed in AZ726 developing solution (3:1 to water) for 25 seconds to form the first light-shielding layer having a plurality of through-holes. Then, aluminum oxide is evaporated in the through-holes by electron beam under a vacuum degree of $3\times10^{-4}$ Pa at an evaporation deposition rate of 1 angstrom/second for 300 seconds to reach to a deposition thickness of 30 nm, so as to obtain the patterned insulating layer 200. Then, the first cathode, the first electron transport layer, and the patterned insulating layer 200 are soaked into acetone, and the first light-shielding layer is ultrasonically removed.

B14. Forming the patterned second electrode on the patterned insulating layer, wherein the orthographic projection of the patterned second electrode on the first functional layer is located within the orthographic projection of the patterned insulating layer corresponding to the patterned second electrode on the first functional layer.

Specifically, the first cathode, the first electron transport layer, and the patterned insulating layer 200 are dried, and then the material of the second light-shielding layer is spin-coated on the first electron transport layer and the patterned insulating layer 200 at a spin-coating speed of 3000 rpm for 30 seconds, and heat-treated at 110° C. for 2 minutes. Then, the material of the second light-shielding layer is exposed to an ultraviolet lamp using a second photolithographic mask for 5 seconds, and developed in AZ726 developing solution (3:1 to water) for 25 seconds, whereby the material of the second light-shielding layer is formed into the second light-shielding layer having a plurality of via holes. The via holes extend through the second light-shielding layer to expose a portion of the patterned insulating layer 200, and are correspondingly disposed in the second light-shielding layer. Then, under a vacuum degree of 3×10−4 Pa, a conductive material Ni is evaporated in the via holes by electron beam at an evaporation deposition rate of 1 angstrom/second for 900 seconds to reach to a deposition thickness of 90 nm, to obtain the patterned second electrode 300. The patterned second electrode 300 is a patterned second anode.

B15. Forming a patterned second functional layer on the patterned second electrode.

Specifically, the first cathode, the first electron transport layer, the patterned insulating layer 200, the patterned anode, and the second light-shielding layer are soaked into acetone, and the second light-shielding layer is ultrasonically removed. Then, the first cathode, the first electron transport layer, the patterned insulating layer 200, and the patterned anode are placed on a hot plate for heat treatment. That is, the surface of the patterned anode is subjected to oxidation treatment, and the conductive material Ni is oxidized to form a conductive nickel oxide material. The oxide of the conductive material is the second hole transport layer as the patterned second hole functional layer, wherein the heat treatment temperature is 300 degrees Celsius, and the heat treatment time is 30 minutes.

B16. Forming the light-emitting layer on the first functional layer and the patterned second functional layer.

Specifically, 20 mg/mL of ZnSeTe/ZnS is spin-coated on the first functional layer and the patterned second functional layer at a spin-coating speed of 2000 rpm for 30 seconds to form a red light-emitting layer.

Then, the encapsulation structure is formed on the light-emitting layer. The encapsulation structure is formed by alternately stacking an inorganic layer(s) and an organic layer(s). Then, the current, voltage and luminance data of the light-emitting device 10 are tested to determine the electrical performance of the device, and the operating life data of the light-emitting device 10 is tested using a constant current drive of 2 mA to determine the operating life of the light-emitting device 10.

Figure 5:
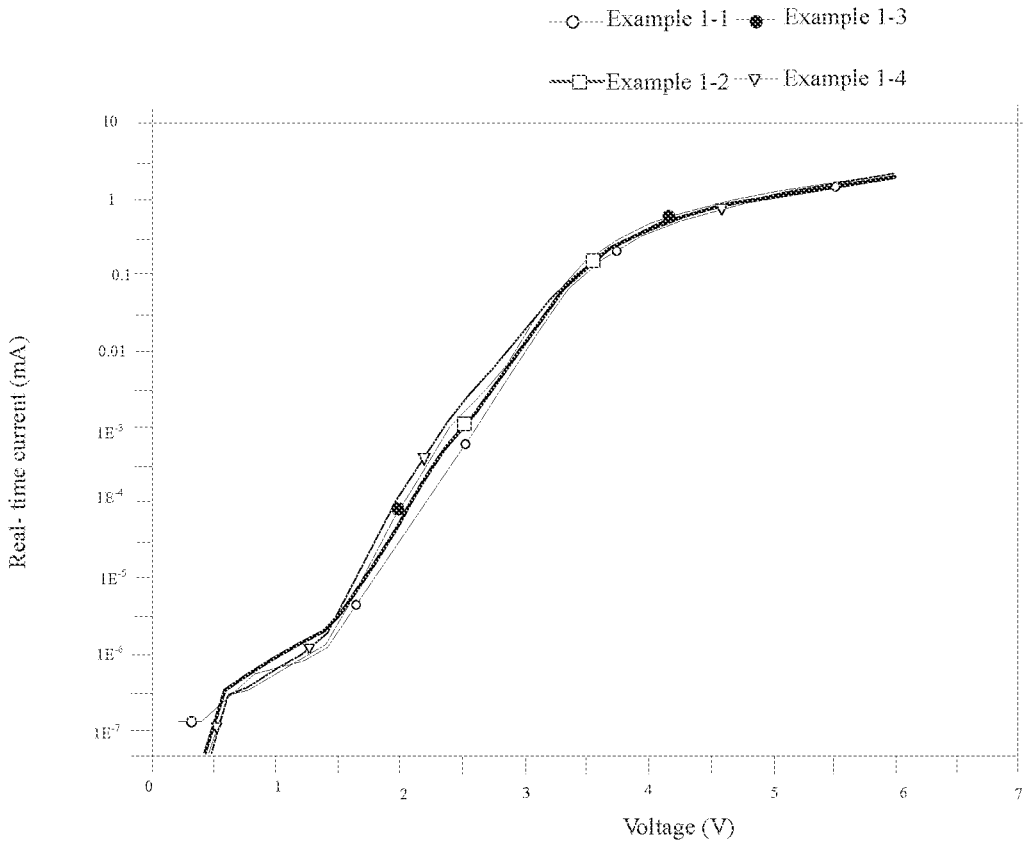
FIG. 5 is a schematic graph of current leakage data of a light-emitting device according to Example 1 of the present disclosure.

It is to be noted that Examples 1-1, 1-2, 1-3, and 1-4 in FIG. 5 means that the device is subjected to four measurements. In the present disclosure, after the second light-shielding layer is removed, the surface of the patterned second anode is oxidized, so that the patterned second hole transport layer is formed on the surface of the patterned second anode. That is, the patterned second hole transport layer is formed by an oxidation method, and the orthographic projection of the patterned second hole transport layer on the first electron transport layer is located within the orthographic projection of the patterned insulating layer 200 on the first electron transport layer, thereby avoiding the contact of the patterned second hole transport layer with the first electron transport layer, further avoiding the current leakage problem of the light-emitting device 10, and ensuring normal display of the light-emitting device 10.

Example 2

Referring still to FIG. 1, it is to be noted that Example 2 differs from Example 1 in that, in step B15, the patterned second hole functional layer is formed on the patterned insulating layer 200 and the patterned second anode by the second method. The material of the patterned second anode includes an anode material, and the material of the patterned second hole functional layer is a hole functional layer material selected from one or more of nickel oxide, copper oxide, poly(3,4-ethylenedioxythiophene):polystyrene sulfonate, cuprous thiocyanate, polyvinyl carbazole, poly[N, N'-bis(4-butylphenyl)-N,N'-bis(phenyl)benzidine] (Poly-TPD), poly(9,9-dioctylfluorene-co-bis(N,N-phenyl-1,4-phenylenediamine) (PFB), 4,4',4"-tris(carbazol-9-yl)-triphenylamine (TCTA), 4,4'-bis(9-carbazolyl)-biphenyl (CBP), N,N'-diphenyl-N,N'-di(3-methylphenyl)-1,1'-biphenyl-4,4'-diamine (TPD), or N,N'-diphenyl-N,N'-(1-naphthyl)-(1,1'-biphenyl)-4,4'-diamine (NPB). Preferably, the material of the patterned second anode is Ag, and the hole functional layer material is PEDOT:PSS. That is, Ni in Example 1 is replaced with Ag, and nickel oxide is replaced with PEDOT:PSS. In addition, the second light-shielding layer is removed not after step B14, but after step B15.

Specifically, the patterned second anode is formed with Ag in the via holes, and then the first cathode, the first electron transport layer, the patterned insulating layer 200, and the patterned second anode are placed in an aqueous solution of sodium polystyrene sulfonate (PSSNa) (at 0.1 mole per liter) and 3,4-ethylenedioxythiophene (EDOT) (at 0.015 mole per liter). A voltage of 1.1 volts is applied to the patterned second anode for 120 seconds using a saturated calomel electrode as a reference electrode to form the patterned second hole transport layer as the patterned second hole functional layer. Then, the second light-shielding layer is removed. Other steps are same as those in Example 1, and details are not repeated herein.

In the present disclosure, after the patterned second anode is formed in the via holes, the patterned second hole transport layer 400 is formed in the via holes by electrochemical deposition. Then, the second light-shielding layer is removed. These procedures enable to prevent the surface of the nickel oxide patterned second hole transport layer 400 or the copper oxide patterned second hole transport layer 400 prepared by heating and oxidizing the second anode in air from having more defects, and to prevent from difficult control of the degree of oxidation and disadvantageous transport of holes, thereby improving the performance of the light-emitting device 10.

Example 3

Referring still to FIG. 2, it is to be noted that Example 3 differs from Example 1 in that after Step B16, it further includes the following steps:

The light-emitting layer 500 is preferably a blue light-emitting layer, and the third functional layer 700 is formed on the light-emitting layer 500. Then, the third electrode 800 is formed on the third functional layer 700.

Specifically, the third functional layer 700 is a third electron transport layer as the third electron functional layer, and a material of the third functional layer is an electron functional layer material. A material of the third electrode is a cathode material, and the third electrode 800 is a third cathode. After the light-emitting layer 500 is formed on the patterned second anode, 30 mg/L of ZnO nanoparticles are spin-coated on the light-emitting layer 500 at a spin-coating speed of 3000 rpm for 30 seconds to form the third electron transport layer. Then, Ag is evaporated by electron beam under a vacuum degree of $3 \times 10^{-4}$ Pa at an evaporation deposition rate of 1 angstrom/second for 200 seconds to reach to a deposition thickness of 20 nm, so as to form the third cathode. Other steps are same as those in Example 1, and details are not repeated herein.

Example 4

Referring still to FIG. 2, it is to be noted that Example 4 differs from Example 3 in that, in step B15, the patterned second hole functional layer is formed on the patterned insulating layer 200 and the patterned second anode by the second method. A material of the patterned second anode includes an anode material, and a material of the patterned second hole functional layer is a hole functional layer material. The hole functional layer material is selected from one or more of nickel oxide, copper oxide, poly(3,4-ethylenedioxythiophene):polystyrene sulfonate, cuprous thiocyanate, polyvinyl carbazole, poly[N,N'-bis(4-butylphenyl)-N,N'-bis(phenyl)benzidine](Poly-TPD), poly(9,9-dioctylfluorene-co-bis(N,N-phenyl-1,4-phenylenediamine) (PFB), 4,4',4"-tris(carbazol-9-yl)-triphenylamine (TCTA), 4,4'-bis(9-carbazolyl)-biphenyl (CBP), N,N'-diphenyl-N,N'-di(3-methylphenyl)-1,1'-biphenyl-4,4'-diamine (TPD), or N,N'-diphenyl-N,N'-(1-naphthyl)-(1,1'-biphenyl)-4,4'-diamine (NPB). Preferably, the material of the patterned second anode is Ag, and the material of the patterned second hole functional layer is PEDOT:PSS. That is, the step of forming the patterned second anode by Ni in Example 3 is replaced by the step of forming the patterned second anode by Ag, and the nickel oxide is replaced by PEDOT:PSS. In addition, the second light-shielding layer is removed not after step B14 but after step B15.

Specifically, after the patterned second anode is formed with Ag, the first cathode, the first electron transport layer, the patterned insulating layer 200, and the patterned second anode are placed in an aqueous solution of sodium polystyrene sulfonate (PSSNa) (at 0.1 mole per liter) and 3,4-ethylenedioxythiophene (EDOT) (at 0.015 mole per liter), and a voltage of 1.1 volts is applied to the patterned second anode for 120 seconds using a saturated calomel electrode as a reference electrode to form the patterned second hole transport layer as the patterned second hole functional layer. Then, the second light-shielding layer is removed. Other steps are same as those in Example 3, and details are not repeated herein.

Example 5

Referring still to FIG. 1, it is to be noted that Example 5 differs from Example 1 in that the light-emitting device 10 is an upright light-emitting device, in which the first electrode 600 is a first anode, the patterned second electrode 300 is a patterned second cathode, the first functional layer 100 is a first hole transport layer as the first hole functional layer, and the patterned second functional layer 400 is a second electron transport layer as the patterned second electron functional layer.

Example 6

Referring still to FIG. 2, it is to be noted that Example 6 differs from Example 5 in that after Step B16, it further includes the following steps:

The light-emitting layer 500 is preferably a blue light-emitting layer, and the third functional layer 700 is formed on the light-emitting layer 500. Then, the third electrode 800 is formed on the third functional layer 700.

Specifically, the third functional layer 700 is a third hole transport layer as the third hole functional layer, and a material of the third functional layer is a hole functional layer material. A material of the third electrode is an anode material, and the third electrode 800 is a third anode. After the light-emitting layer 500 is formed on the patterned second cathode, 30 mg/L of ZnO nanoparticles are spin-coated on the light-emitting layer 500 at a spin-coating speed of 3000 rpm for 30 seconds to form the third hole transport layer. Then, Ag is evaporated by electron beam under a vacuum degree of $3 \times 10^{-4}$ Pa at an evaporation deposition rate of 1 angstrom/second for 200 seconds to reach to a deposition thickness of 20 nm, so as to form the third anode. Other steps are same as those in Example 5, and details are not repeated herein.

Comparative Example 1

Referring to FIG. 4, it is a schematic structural diagram of a light-emitting device in the prior art. Comparative Example 1 differs from Example 1 in that in Comparative Example 1, after the step of forming a patterned insulating layer 201 using the first light-shielding layer, a patterned second anode 301 is immediately formed with remaining the first light-shielding layer, wherein an edge of the orthographic projection of the patterned second anode 301 on a first electron transport layer 101 coincides with an edge of the orthographic projection of the patterned insulating layer 201 on the first electron transport layer 101, and then the patterned second anode 301 is heated such that a portion of Ni is oxidized to form a patterned second hole transport layer 401, wherein an orthographic projection of the patterned second hole transport layer 401 on the first electron transport layer 101 is greater than the orthographic projection of the patterned insulating layer 201 on the first electron transport layer 101. Other steps are same as those in Example 1, and details are not repeated herein.

Comparative Example 2

Comparative Example 2 differs from Example 1 in that in Comparative Example 2, the electron transport layer, the light-emitting layer, the hole transport layer, and the anode are sequentially stacked on the cathode. Other steps are same as those in Example 1, and details are not repeated herein.

Figure 6:
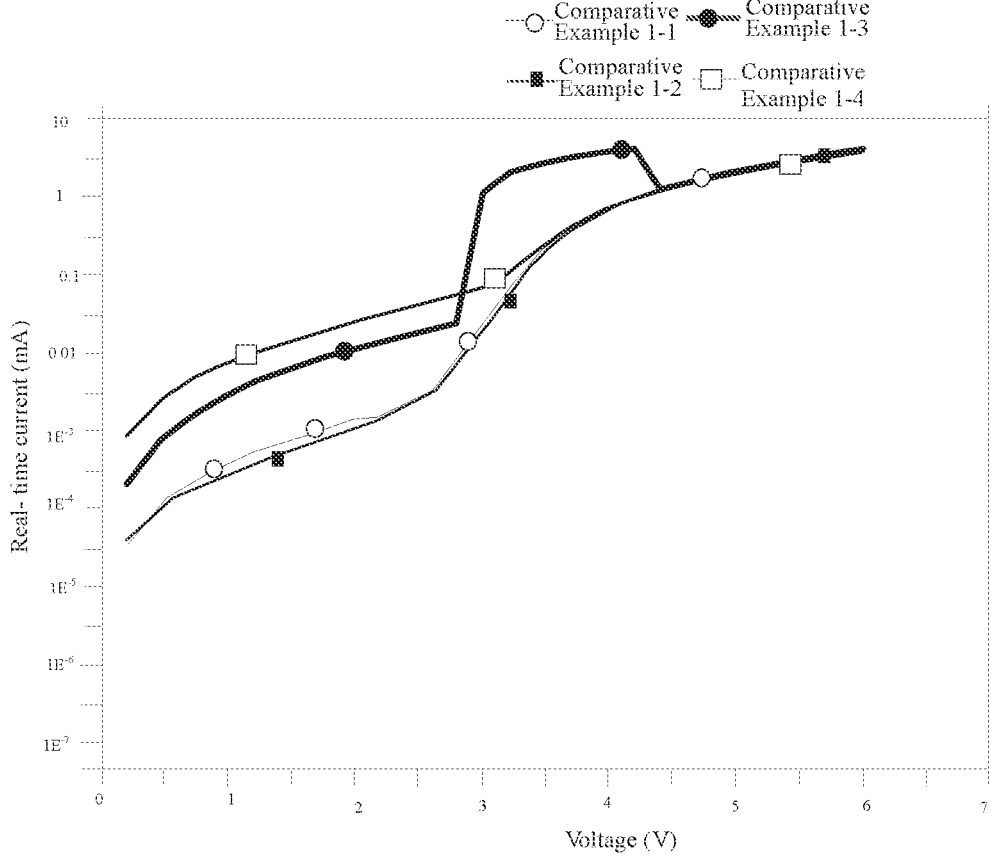
FIG. 6 is a schematic graph of current leakage data of a light-emitting device according to Comparative Example 1 of the present disclosure.

Referring to FIGS. 5 to 7, FIG. 5 is a schematic graph of current leakage of a light-emitting device according to Example 1 of the present disclosure, FIG. 6 is a schematic graph of current leakage of a light-emitting device according to Comparative Example 1 of the present disclosure, and FIG. 7 is a schematic graph of luminance versus time of a light-emitting device according to an embodiment of the present disclosure.

In the present disclosure, the orthographic projection of the patterned second anode on the first electron transport layer is disposed within the orthographic projection of the patterned insulating layer 200 on the first electron transport layer. After four measurements, the current of the light-emitting device 10 in the present disclosure tends to be smooth, that is, the light-emitting device 10 of the present disclosure has no current leakage problem. However, in the existing light-emitting device, an edge of the patterned second anode 301 coincides with an edge of the patterned insulating layer 201, and when Ni is heated in air to form nickel oxide, the nickel oxide is easily formed at edges of Ni and the underlying patterned insulating layer 200, causing the hole transport material nickel oxide to be in direct contact with the underlying electron transport layer material and causing the current leakage problem of the light-emitting device 10. Therefore, the orthographic projection of the patterned second anode on the first electron transport layer is disposed within the orthographic projection of the patterned insulating layer 200 on the first electron transport layer, and in that case, Ni is heated and oxidized to form the patterned second hole transport layer, thereby effectively reducing the probability of contact of the patterned second hole transport layer with the first electron transport layer, thereby avoiding the current leakage problem of the light-emitting device 10, and improving the performance of the light-emitting device 10.

Referring to FIGS. 7 to 9, FIG. 8 is a comparison graph of voltage versus luminance of light-emitting devices according to Example 2 and Comparative Example 1 of the present disclosure, and FIG. 9 is a comparison graph of luminance versus external quantum efficiency of light-emitting devices according to Example 2 and Comparative Example 1 of the present disclosure.

In the present disclosure, the orthographic projection of the patterned second anode on the first electron transport layer is disposed within the orthographic projection of the patterned insulating layer 200 on the first electron transport layer, and the patterned second anode is formed with Ag, so that the luminance of the light-emitting device 10 can be up to greater than $10^4$. When the luminance of the light-emitting device 10 is $10^4$, the external quantum efficiency thereof can reach to 16%, thereby improving the display effect of the light-emitting device 10. However, in the existing light-emitting device, an edge of the patterned insulating layer 201 coincides with an edge of the patterned second anode 301, the luminance of the light-emitting device 10 is less than $10^4$, and even when the luminance of the light-emitting device 10 is $10^4$, the external quantum efficiency may reach up to 9% only. Therefore, the light-emitting device 10 of the present disclosure can effectively reduce the probability of contact of the patterned second hole transport layer with the first electron transport layer, thereby avoiding the current leakage problem of the light-emitting device 10, and improving the performance of the light-emitting device 10. In addition, Ag has a good conductivity, which can improve the transport efficiency of holes, thereby improving the performance of the light-emitting device 10. In addition, the patterned second hole transport layer can be prepared by electrochemical deposition, and materials to be used to prepare the patterned second hole transport layer by electrochemical deposition are selected in a wide range, for example, a cheap material may be selected in a case of low cost budget to reduce the cost.

Figure 10:
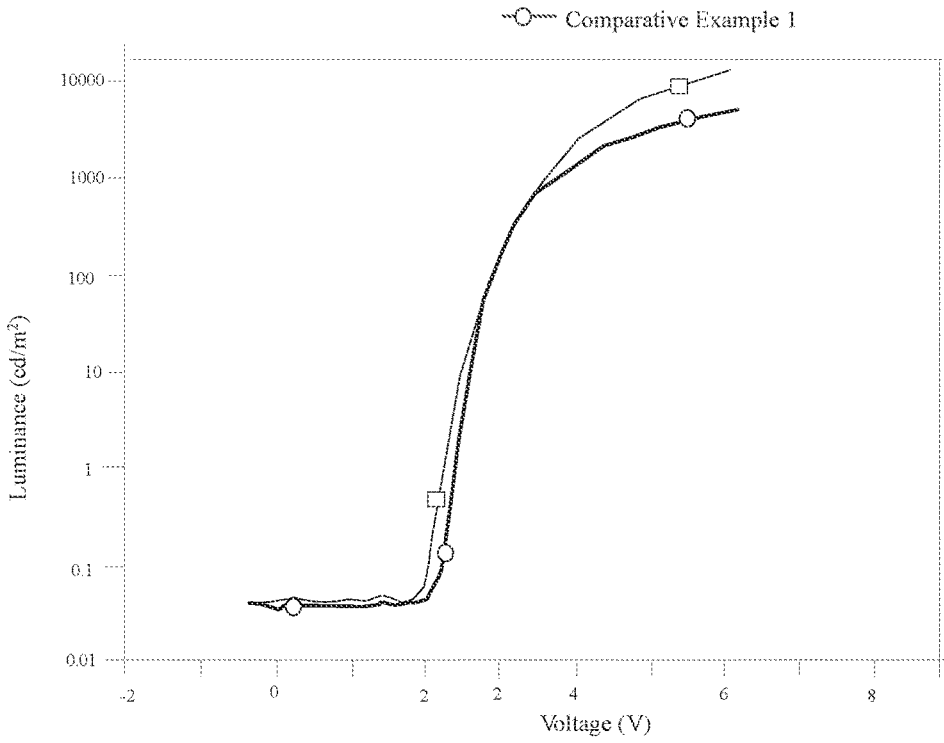
FIG. 10 is a comparison graph of voltage versus luminance of light-emitting devices according to Example 3 and Comparative Example 1 of the present disclosure.
Figure 11:
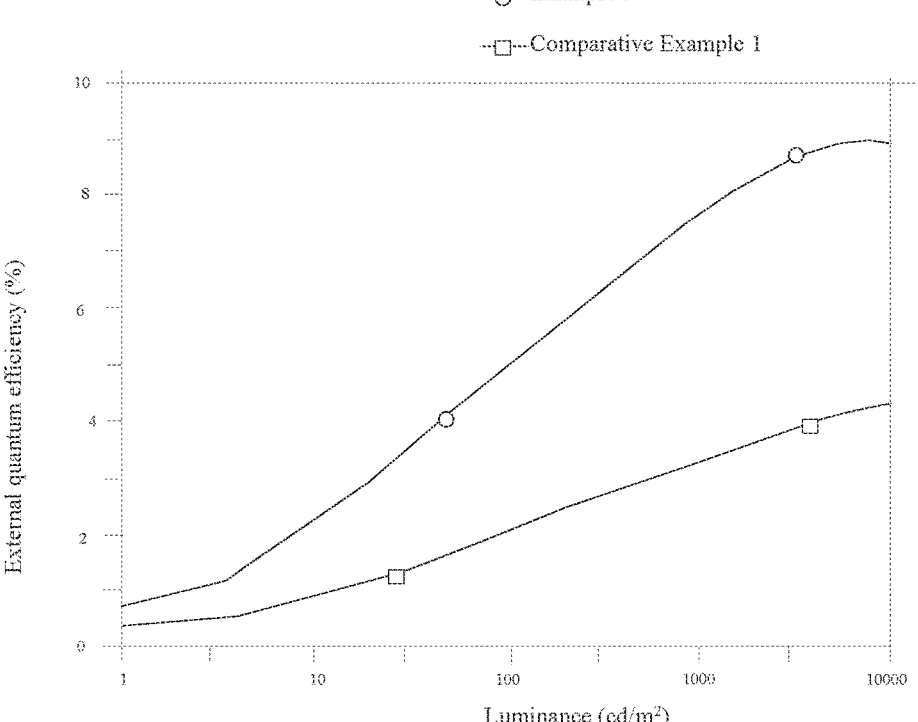
FIG. 11 is a comparison graph of luminance versus external quantum efficiency of light-emitting devices according to Example 3 and Comparative Example 1 of the present disclosure.

Referring to FIGS. 7, 10 and 11, FIG. 10 is a comparison graph of voltage versus luminance of light-emitting devices according to Example 3 and Comparative Example 1 of the present disclosure, and FIG. 11 is a comparison graph of luminance versus external quantum efficiency of light-emitting devices according to Example 3 and Comparative Example 1 of the present disclosure.

In the present disclosure, the orthographic projection of the patterned second anode on the first electron transport layer is disposed within the orthographic projection of the patterned insulating layer 200 on the first electron transport layer, and the third electron transport layer 700 and the third electrode 800 are provided on the light-emitting layer 500, so that the luminance of the light-emitting device 10 can be up to greater than $10^4$. When the luminance of the light-emitting device 10 is $10^4$, the external quantum efficiency can reach to 9%, and the service life can be as long as 15 hours, thereby improving the display effect of the light-emitting device 10. However, the existing light-emitting device has a luminance less than $10^4$, and even when the luminance of the light-emitting device reaches to $10^4$, the external quantum efficiency thereof may be up to 4% only. Therefore, the light-emitting device 10 of the present disclosure can effectively reduce the probability of contact of the patterned second hole transport layer with the first electron transport layer, thereby avoiding the current leakage problem of the light-emitting device 10, and improving the performance of the light-emitting device 10. In addition, the third electron transport layer 700 and the third electrode 800 are provided on the light-emitting layer 500, so that the effective contact area between the electron transport layer and the light-emitting layer 500 is increased, thereby increase the injection amount of electrons, balancing injection of holes and electrons in the light-emitting layer 500, and improving the performance and life of the light-emitting device 10.

Figure 12:
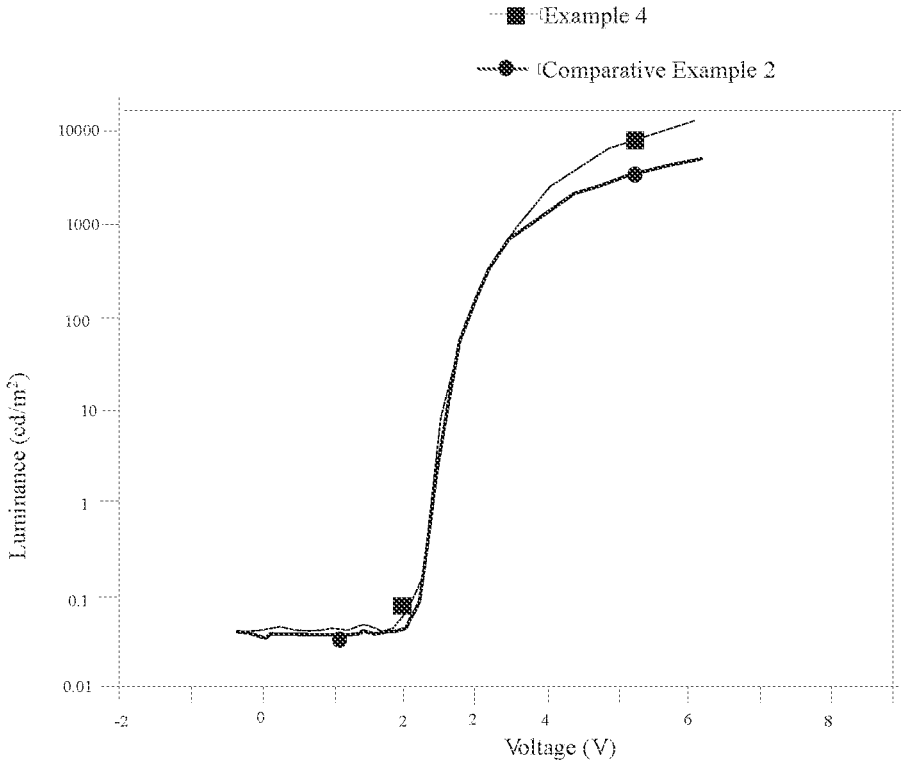
FIG. 12 is a comparison graph of voltage versus luminance of light-emitting devices according to Example 4 and Comparative Example 2 of the present disclosure.
Figure 13:
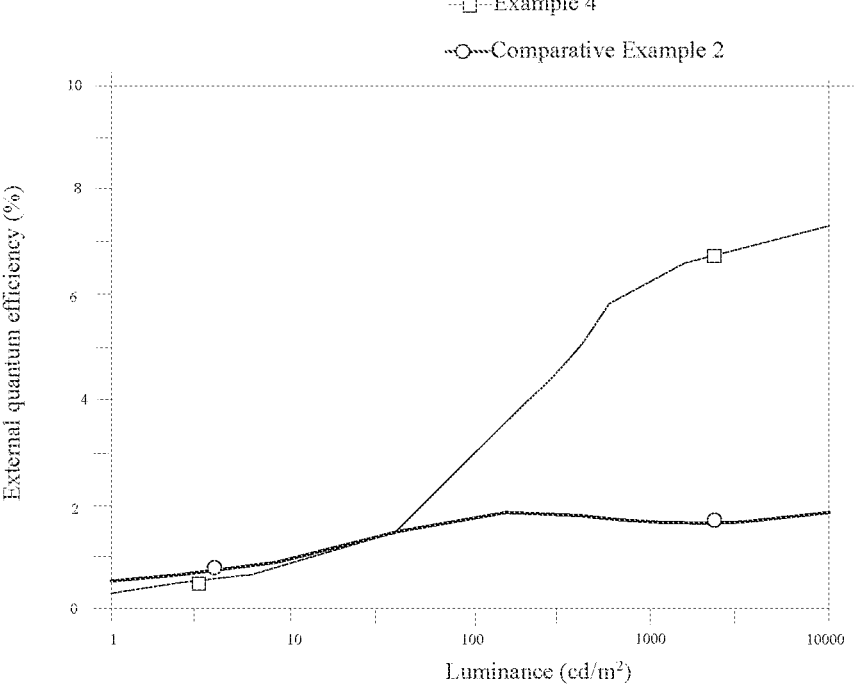
FIG. 13 is a comparison graph of luminance versus external quantum efficiency of light-emitting devices according to Example 4 and Comparative Example 2 of the present disclosure.

Referring to FIGS. 7, 12 and 13, FIG. 12 is a comparison graph of voltage versus luminance of light-emitting devices according to Example 4 and Comparative Example 2 of the present disclosure, and FIG. 13 is a comparison graph of luminance versus external quantum efficiency of light-emitting devices according to Example 4 and Comparative Example 2 of the present disclosure.

In the present disclosure, the orthographic projection of the patterned second anode on the first electron transport layer is disposed within the orthographic projection of the patterned insulating layer 200 on the first electron transport layer, and the patterned second anode is formed with Ag, so that the luminance of the light-emitting device 10 can be up to greater than $10^4$. When the luminance of the light-emitting device 10 is $10^4$, the external quantum efficiency can reach to 18%, thereby improving the display effect of the light-emitting device 10. However, in the existing light-emitting device, the light-emitting layer is wrapped between a hole transport layer and an electron transport layer, so that the luminance of the light-emitting device is less than $10^4$, and even when the luminance of the existing light-emitting device is $10^4$, the external quantum efficiency thereof may be up to 3% only. Therefore, the light-emitting device 10 of the present disclosure can effectively reduce the probability of contact of the patterned second hole transport layer with the first electron transport layer, thereby avoiding the current leakage problem of the light-emitting device 10, and improving the performance of the light-emitting device 10. In addition, Ag has a good conductivity, which can improve the transport efficiency of holes, thereby improving the performance of the light-emitting device 10. In addition, the patterned second hole transport layer can be prepared by electrochemical deposition, and materials to be used to prepare the patterned second hole transport layer by electrochemical deposition are selected in a wide range, for example, a cheap material may be selected in a case of low cost budget to reduce the cost.

An embodiment of the present disclosure discloses a light-emitting device 10 and a method of manufacturing the same, in which the orthographic projection of the patterned second electrode 300 on the first functional layer 100 is located within the orthographic projection of the patterned insulating layer 200 on the first functional layer 100, so as to avoid the contact of the patterned second functional layer 400 with the first functional layer 100, thereby avoiding a current leakage problem of the light-emitting device 10, and improving performance of the light-emitting device 10. Other film layers of the light-emitting device 10 are formed first, followed by the light-emitting layer 500, so as to avoid damage to the light-emitting layer 500 during deposition of other film layer materials, and to avoid that the fluorescence of the light-emitting layer 500 may be shielded by other film layers due to the fact that the light-emitting layer 500 is wrapped within other film layers of the light-emitting device 10, thereby improving the display effect of the light-emitting device 10 and improving the performance of the light-emitting device 10. The third functional layer 700 and the third electrode 800 are provided on the light-emitting layer to increase the effective contact area between the electron transport layer and the light-emitting layer 500, that is, the effective contact area between the first functional layer 100 and the patterned second functional layer 400 and the light-emitting layer 500, so that holes and electrons in the light-emitting layer region are balanced, thereby facilitating the balance of charges inside the light-emitting device 10, and improving the performance of the device.

The light-emitting device and the method of manufacturing the same according to embodiments of the present disclosure are described in detail above. Specific examples are used herein to illustrate the principles and implementations of the present disclosure. The description of the above embodiments is merely provided to help understand the method of the present disclosure and the core idea thereof. Variations may be made by those skilled in the art in both the detailed implementation and scope of application in accordance with the teachings of the present disclosure. In view of the foregoing, the present description should not be construed as limiting the application.

What is claimed is:

1. A light-emitting device comprising:
   a first electrode;
   a first functional layer disposed on the first electrode;

a patterned insulating layer disposed on the first functional layer and at least partially exposing the first functional layer;

a patterned second electrode disposed on the patterned insulating layer, an orthographic projection of the patterned second electrode on the first functional layer being located within an orthographic projection of the patterned insulating layer corresponding to the patterned second electrode on the first functional layer;

a patterned second functional layer covering the patterned second electrode; and a light-emitting layer disposed on the first functional layer and covering the patterned second functional layer and the first functional layer;

wherein one of the first electrode and the patterned second electrode is an anode, and another is a cathode; one of the first functional layer and the patterned second functional layer is an electron functional layer, and another is a hole functional layer; the electron functional layer is close to the cathode, and the hole functional layer is close to the anode.

2. The light-emitting device according to claim 1, wherein an orthographic projection of the patterned second functional layer on the first functional layer is located within an orthographic projection of the patterned insulating layer corresponding to the patterned second functional layer on the first functional layer.

3. The light-emitting device according to claim 2, wherein a distance between an edge of the orthographic projection of the patterned second functional layer on the first functional layer and an edge of the orthographic projection of the patterned insulating layer corresponding to the patterned second functional layer on the first functional layer is greater than 5 nm.

4. The light-emitting device according to claim 1, wherein the patterned insulating layer has a thickness of 30 nm to 100 nm.

5. The light-emitting device according to claim 1, wherein a distance between an edge of the orthographic projection of the patterned second electrode on the first functional layer and an edge of the orthographic projection of the patterned insulating layer corresponding to the patterned second electrode on the first functional layer is greater than a range from 20 nm to 105 nm.

6. The light-emitting device according to claim 1, wherein a material of the anode is selected from one or more of Pt, Ni, Cu, Ag, Al, or Au;

a material of the cathode is selected from one or more of ITO, FTO, Fe, Cu, Al, Sn, Zn, or Ag;

a material of the hole functional layer is selected from one or more of nickel oxide, copper oxide, poly(3,4-ethylenedioxythiophene):polystyrene sulfonate, cuprous thiocyanate, polyvinyl carbazole, poly[N,N'-bis(4-butylphenyl)-N,N'-bis(phenyl)benzidine] (Poly-TPD), poly(9,9-dioctylfluorene-co-bis(N,N-phenyl-1,4-phenylenediamine) (PFB), 4,4',4''-tris(carbazol-9-yl)-triphenylamine (TCTA), 4,4'-bis(9-carbazolyl)-biphenyl (CBP), N,N'-diphenyl-N,N'-di(3-methylphenyl)-1,1'-biphenyl-4,4'-diamine (TPD), or N,N'-diphenyl-N,N'-(1-naphthyl)-(1,1'-biphenyl)-4,4'-diamine (NPB);

a material of the electron functional layer is selected from one or more of $TiO_2$, ZnO, SnO, ZnMgO, AlZnO, ZnSnO, ZrO, AlZnMgO, Li-doped $TiO_2$, Ru-doped $TiO_2$, doped graphene, undoped graphene, $C_{60}$, GaZnO, or ZnMgLiO; and the light-emitting layer is a quantum dot light-emitting layer, a material of the quantum dot light-emitting layer is selected from one or more of a single-structural quantum dot or a core-shell structural quantum dot, the single-structural quantum dot is selected from one or more of a group II-VI compound, a group III-V compound, or a group I-III-VI compound, the group II-VI compound is selected from one or more of CdSe, CdS, CdTe, ZnSe, ZnS, CdTe, ZnTe, CdZnS, CdZnSe, CdZnTe, ZnSeS, ZnSeTe, ZnTeS, CdSeS, CdSeTe, CdTeS, CdZnSeS, CdZnSeTe, or CdZnSTe; the group III-V compound is selected from one or more of InP, InAs, GaP, GaAs, GaSb, AlN, AlP, InAsP, InNP, InNSb, GaAlNP, or InAlNP; the group I-III-VI compound is selected from one or more of $CuInS_2$, $CuInSe_2$, or $AgInS_2$; a core layer of the core-shell structural quantum dot is any of the single-structural quantum dot, and a shell layer of the core-shell structural quantum dot is selected from one or more of CdS, CdTe, CdSeTe, CdZnSe, CdZnS, CdSeS, ZnSe, ZnSeS, or ZnS.

7. The light-emitting device according to claim 1, wherein an orthographic projection of the patterned second electrode on the patterned insulating layer is located within an orthographic projection of the patterned second functional layer corresponding to the patterned second electrode on the patterned insulating layer.

8. The light-emitting device according to claim 1, wherein the patterned insulating layer exposes a portion of the first functional layer, and the patterned insulating layer comprises a plurality of patterned insulating layer sections and one or more patterned insulating layer connection sections connected to adjacent patterned insulating layer sections.

9. The light-emitting device according to claim 7, wherein an orthographic projection of the patterned second functional layer on the first functional layer is located within an orthographic projection of the patterned insulating layer corresponding to the patterned second functional layer on the first functional layer.

10. The light-emitting device according to claim 9, wherein a distance between an edge of the orthographic projection of the patterned second functional layer on the first functional layer and an edge of the orthographic projection of the patterned insulating layer corresponding to the patterned second functional layer on the first functional layer is greater than 5 nm; and a distance between an edge of the orthographic projection of the patterned second electrode on the first functional layer and an edge of the orthographic projection of the patterned insulating layer corresponding to the patterned second electrode on the first functional layer is greater than a range from 20 nm to 105 nm.

11. A method of manufacturing a light-emitting device, comprising:

providing a first electrode;

forming a first functional layer on the first electrode;

forming a patterned insulating layer on the first functional layer, the patterned insulating layer at least partially exposing the first functional layer;

forming a patterned second electrode on the patterned insulating layer, wherein an orthographic projection of the patterned second electrode on the first functional layer is located within an orthographic projection of the patterned insulating layer corresponding to the patterned second electrode on the first functional layer;

forming a patterned second functional layer on the patterned second electrode; and forming a light-emitting layer on the first functional layer and the patterned second functional layer;

wherein one of the first electrode and the patterned second electrode is an anode, and another is a cathode; one of the first functional layer and the patterned second functional layer is an electron functional layer, and another is a hole functional layer; the electron functional layer is close to the cathode, and the hole functional layer is close to the anode.

12. The method of manufacturing the light-emitting device according to claim 11, wherein the step of forming the patterned insulating layer on the first functional layer, the patterned insulating layer at least partially exposing the first functional layer, comprises:

forming a first light-shielding layer having a plurality of through-holes on the first functional layer, the through-holes extending through the first light-shielding layer to expose a portion of the first functional layer;

forming a patterned insulating layer in the through-holes; and removing the first light-shielding layer.

13. The method of manufacturing the light-emitting device according to claim 12, wherein the step of forming the patterned second electrode on the patterned insulating layer comprises:

forming a second light-shielding layer having a plurality of via holes on the first functional layer and the patterned insulating layer, the via holes corresponding to the patterned insulating layer, and the via holes extending through the second light-shielding layer to expose a portion of the patterned insulating layer; and forming a patterned second electrode in the via holes, wherein the orthographic projection of the patterned second electrode on the first functional layer is located within the orthographic projection of the patterned insulating layer on the first functional layer.

14. The method of manufacturing the light-emitting device according to claim 13, wherein the step of forming the patterned second functional layer on the patterned second electrode comprises:

removing the second light-shielding layer; and oxidizing the patterned second electrode to form the patterned second functional layer on a surface of the patterned second electrode, wherein an orthographic projection of the patterned second functional layer on the first functional layer is located within an orthographic projection of the patterned insulating layer on the first functional layer.

15. The method of manufacturing the light-emitting device according to claim 14, wherein a material of the patterned second electrode comprises a conductive material, and a material of the patterned second functional layer comprises an oxide of the conductive material.

16. The method of manufacturing the light-emitting device according to claim 14, wherein the patterned second electrode is an anode, the patterned second functional layer is a hole functional layer, a material of the anode is selected from one or two of Ni or Cu, and a material of the hole functional layer is selected from one or two of nickel oxide or copper oxide.

17. The method of manufacturing the light-emitting device according to claim 14, wherein the patterned second electrode is a cathode, the patterned second functional layer is an electron functional layer, a material of the cathode is selected from one or two of Ti, Zn, or Sn, and a material of the electron functional layer is selected from one or two of $TiO_2$, ZnO, or $SnO_2$.

18. The method of manufacturing the light-emitting device according to claim 13, wherein the step of forming the patterned second functional layer on the patterned second electrode comprises:

depositing a material of the patterned second functional layer on the patterned insulating layer and the patterned second electrode to form the patterned second functional layer, wherein an orthographic projection of the patterned second functional layer on the first functional layer is located within the orthographic projection of the patterned insulating layer on the first functional layer; and removing the second light-shielding layer.

19. The method of manufacturing the light-emitting device according to claim 18, wherein the patterned second electrode is an anode, the patterned second functional layer is a hole functional layer, a material of the anode is selected from one or more of Pt, Ni, Cu, Ag, Al, or Au, and a material of the hole functional layer is selected from one or more of nickel oxide, copper oxide, poly(3,4-ethylenedioxythiophene):polystyrene sulfonate, cuprous thiocyanate, polyvinyl carbazole, poly[N,N'-bis(4-butylphenyl)-N,N'-bis(phenyl)benzidine] (Poly-TPD), poly(9,9-dioctylfluorene-co-bis (N,N-phenyl-1,4-phenylenediamine) (PFB), 4,4',4"-tris (carbazol-9-yl)-triphenylamine (TCTA), 4,4'-bis(9-carbazolyl)-biphenyl (CBP), N,N'-diphenyl-N,N'-di(3-methylphenyl)-1,1'-biphenyl-4,4'-diamine (TPD), or N,N'-diphenyl-N,N'-(1-naphthyl)-(1,1'-biphenyl)-4,4'-diamine (NPB).

20. The method of manufacturing the light-emitting device according to claim 18, wherein the patterned second electrode is a cathode, the patterned second functional layer is an electron functional layer, a material of the cathode is selected from one or more of ITO, FTO, Fe, Cu, Al, Sn, Zn, or Ag, and a material of the electron functional layer is selected from one or more of $TiO_2$, ZnO, SnO, ZnMgO, AlZnO, ZnSnO, ZrO, AlZnMgO, Li-doped $TiO_2$, Ru-doped $TiO_2$, doped graphene, undoped graphene, $C_{60}$, GaZnO, or ZnMgLiO.

* * * * *